US010719012B2

(12) United States Patent
Oota et al.

(10) Patent No.: US 10,719,012 B2
(45) Date of Patent: Jul. 21, 2020

(54) CURABLE COMPOSITION, METHOD OF MANUFACTURING CURABLE COMPOSITION, FILM, INFRARED CUT FILTER, INFRARED TRANSMITTING FILTER, PATTERN FORMING METHOD, AND DEVICE

(71) Applicant: FUJIFILM Corporation, Tokyo (JP)

(72) Inventors: Kazuya Oota, Shizuoka (JP); Masahiro Mori, Shizuoka (JP); Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/821,160

(22) Filed: Nov. 22, 2017

(65) Prior Publication Data

US 2018/0094118 A1    Apr. 5, 2018

Related U.S. Application Data

(63) Continuation of application No. PCT/JP2016/064631, filed on May 17, 2016.

(30) Foreign Application Priority Data

Jun. 15, 2015    (JP) .................................. 2015-119994

(51) Int. Cl.
| | |
|---|---|
| *G03F 7/029* | (2006.01) |
| *G03F 7/033* | (2006.01) |
| *G03F 7/16* | (2006.01) |
| *G02B 5/22* | (2006.01) |
| *G03F 7/00* | (2006.01) |
| *G03F 7/031* | (2006.01) |
| *C08K 5/33* | (2006.01) |
| *G03F 7/105* | (2006.01) |
| *G03F 7/038* | (2006.01) |
| *C08K 5/3415* | (2006.01) |
| *C08L 101/00* | (2006.01) |
| *C08L 63/00* | (2006.01) |
| *G02B 5/20* | (2006.01) |
| *C08G 59/32* | (2006.01) |
| *C08G 59/50* | (2006.01) |
| *C08K 5/00* | (2006.01) |
| *G03F 7/20* | (2006.01) |
| *G03F 7/32* | (2006.01) |
| *G03F 7/40* | (2006.01) |
| *H01L 27/146* | (2006.01) |
| *H01L 27/148* | (2006.01) |

(52) U.S. Cl.
CPC ........... *G03F 7/0007* (2013.01); *C08G 59/32* (2013.01); *C08G 59/3218* (2013.01); *C08G 59/506* (2013.01); *C08K 5/0091* (2013.01); *C08K 5/33* (2013.01); *C08K 5/3415* (2013.01); *C08L 63/00* (2013.01); *C08L 101/00* (2013.01); *G02B 5/201* (2013.01); *G02B 5/208* (2013.01); *G02B 5/223* (2013.01); *G03F 7/029* (2013.01); *G03F 7/031* (2013.01); *G03F 7/033* (2013.01); *G03F 7/038* (2013.01); *G03F 7/105* (2013.01); *G03F 7/162* (2013.01); *G03F 7/168* (2013.01); *G03F 7/2039* (2013.01); *G03F 7/322* (2013.01); *G03F 7/40* (2013.01); *H01L 27/14621* (2013.01); *H01L 27/14806* (2013.01); *C08K 5/0041* (2013.01)

(58) Field of Classification Search
CPC ........ G03F 7/0007; G03F 7/033; G03F 7/029; G03F 7/168
USPC ............................................ 430/281.1, 280.1
See application file for complete search history.

(56) References Cited

U.S. PATENT DOCUMENTS

| 5,391,446 A * | 2/1995 | Ohtani .................... G03G 5/055 430/59.6 |
|---|---|---|
| 2010/0076108 A1 | 3/2010 | Miyashita et al. |

FOREIGN PATENT DOCUMENTS

| CN | 101663362 A | 3/2010 |
|---|---|---|
| JP | 4-193882 A | 7/1992 |
| JP | 2005-15682 A | 1/2005 |
| JP | 2006-343631 A | 12/2006 |
| JP | 2009-37058 A | 2/2009 |

OTHER PUBLICATIONS

Enokida et al., "Polymorphism of Oxotitanium Phthalocyanines and Applications for Electrophotographic Receptors," Electrophotography, vol. 29, No. 4, 1990, pp. 373-383 (12 pages total) with an English abstract.

(Continued)

*Primary Examiner* — John S Chu
(74) *Attorney, Agent, or Firm* — Birch, Stewart, Kolasch & Birch, LLP

(57) ABSTRACT

A curable composition includes: an α-type oxytitanium phthalocyanine pigment; and a curable compound. A method of manufacturing a curable composition includes a step of dispersing an α-type oxytitanium phthalocyanine pigment and a pigment other than an oxytitanium phthalocyanine pigment in the presence of a solvent. A film, an infrared cut filter, and an infrared transmitting filter are formed using the curable composition. A pattern forming method includes: a step of forming a curable composition layer on a support using the curable composition; and a step of forming a pattern on the curable composition layer using a photolithography method or a dry etching method. The device is a solid image pickup element, an infrared sensor, or an image display device including the film.

18 Claims, 3 Drawing Sheets

(56) References Cited

OTHER PUBLICATIONS

International Preliminary Report on Patentability and Written Opinion of the International Searching Authority (Forms PCT/IB/326, PCT/IB/373 and PCT/ISA/237) for International Application No. PCT/JP2016/064631, dated Dec. 28, 2017, with English translation.
International Search Report (Form PCT/ISA/210) for International Application No. PCT/JP2016/064631, dated Aug. 16, 2016, with English translation.
Sato et al., "A Study of Dispersion of Carrier Generation Material and Electrophotographic Properties for Photoreceptor using α-form Oxotitanium Phthalocyanine (TiOPc)," The Journal of Imaging Society of Japan, vol. 37, No. 4, 1998, pp. 535-541 (9 pages total) with an English abstract.
Japanese Office Action dated Feb. 12, 2019, for corresponding Japanese Patent Application No. 2017-524738, with machine translation.
Taiwanese Office Action and Search Report for Taiwanese Application No. 105115240, dated Jul. 31, 2019, with partial English translation.

\* cited by examiner

CURABLE COMPOSITION, METHOD OF MANUFACTURING CURABLE COMPOSITION, FILM, INFRARED CUT FILTER, INFRARED TRANSMITTING FILTER, PATTERN FORMING METHOD, AND DEVICE

This application is a Continuation of PCT International Application No. PCT/JP2016/064631 filed on May 17, 2016, which claims priority under 35 U.S.C. § 119(a) to Japanese Patent Application No. 2015-119994 filed on Jun. 15, 2015. Each of the above application(s) is hereby expressly incorporated by reference, in its entirety, into the present application.

BACKGROUND OF THE INVENTION

1. Field of the Invention

The present invention relates to a curable composition, a method of manufacturing a curable composition, a film, an infrared cut filter, an infrared transmitting filter, a pattern forming method, and a device.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using an infrared cut filter.

As the infrared cut filter, for example, a film including an infrared absorber may be used.

JP2006-343631A describes an infrared cut filter including: a transparent resin; and an infrared absorbing composition that includes an oxytitanium phthalocyanine pigment.

SUMMARY OF THE INVENTION

As a result of investigation on the infrared cut filter described in JP2006-343631A, the present inventors found that, in the infrared cut filter in which the infrared absorbing composition described in JP2006-343631A is used, transmittance in a visible range and light shielding properties in a wavelength range of 800 to 900 nm are insufficient.

In addition, as a result of further investigating the infrared cut filter in which the infrared absorbing composition described in JP2006-343631A is used, the present inventors found that transmittance to light in a wavelength range of longer than 900 nm is low.

Accordingly, an object of the present invention is to provide: a curable composition with which a film having excellent transmittance in a visible range and excellent light shielding properties to light in a wavelength range of 800 to 900 nm, a film having excellent light shielding properties to light in a wavelength range of 800 to 900 nm and excellent transmittance to light in a wavelength range of longer than 900 nm, or the like can be manufactured; a method of manufacturing a curable composition; a film; an infrared cut filter; an infrared transmitting filter; a pattern forming method; and a device.

As a result of various investigations, the present inventors found that spectral characteristics of an oxytitanium phthalocyanine pigment vary depending on a crystal structure. Among oxytitanium phthalocyanine pigments, in particular, an α-type oxytitanium phthalocyanine pigment has excellent transmittance in a visible range and excellent spectral characteristics in an infrared range, thereby completing the present invention. The present invention provides the following.

<1> A curable composition comprising:
an α-type oxytitanium phthalocyanine pigment; and
a curable compound.

<2> The curable composition according to <1>,
in which the α-type oxytitanium phthalocyanine pigment is represented by the following Formula (1),

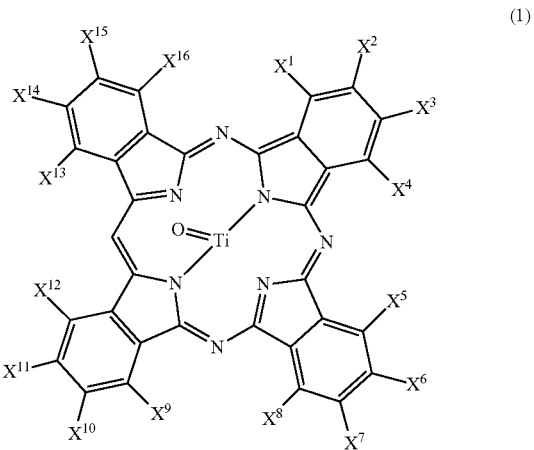

in Formula (1), $X^1$ to $X^{16}$ each independently represent a hydrogen atom or a halogen atom.

<3> The curable composition according to <1> or <2>, further comprising:
a photoradical polymerization initiator,
in which the curable compound includes a photoradically polymerizable compound.

<4> The curable composition according to <3>,
in which the photoradical polymerization initiator is an oxime compound.

<5> The curable composition according to any one of <1> to <4>,
in which the curable compound includes a compound having an epoxy group.

<6> The curable composition according to any one of <1> to <5>, further comprising:
one or more chromatic colorants.

<7> The curable composition according to any one of <1> to <6>, which is a composition for forming an infrared cut filter.

<8> The curable composition according to any one of <1> to <5>, further comprising:
two or more chromatic colorants or an organic black colorant.

<9> The curable composition according to <8>, which is a composition for forming an infrared transmitting filter.

<10> A method of manufacturing the curable composition according to any one of <1> to <9>, the method comprising:
dispersing an α-type oxytitanium phthalocyanine pigment and a pigment other than an oxytitanium phthalocyanine pigment in the presence of a solvent <11> A film which is formed using the curable composition according to any one of <1> to <9>.

<12> An infrared cut filter which is formed using the curable composition according to <7>.

<13> An infrared transmitting filter which is formed using the curable composition according to <9>.

<14> A pattern forming method comprising:

forming a curable composition layer on a support using the curable composition according to any one of <1> to <9>; and forming a pattern on the curable composition layer using a photolithography method or a dry etching method.

<15> A device comprising:

the film according to <11>, in which the device is a solid image pickup element, an infrared sensor, or an image display device.

It is possible to provide: a curable composition with which a film having excellent transmittance in a visible range and excellent light shielding properties to light in a wavelength range of 800 to 900 nm, a film having excellent light shielding properties to light in a wavelength range of 800 to 900 nm and excellent transmittance to light in a wavelength range of longer than 900 nm, or the like can be manufactured; a method of manufacturing a curable composition; a film; an infrared cut filter; an infrared transmitting filter; a pattern forming method; and a device.

DESCRIPTION OF THE PREFERRED EMBODIMENTS

Figure 1:
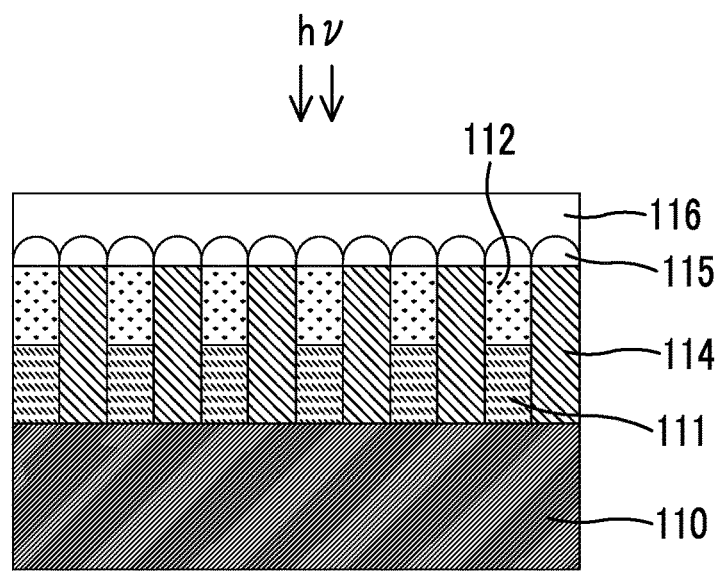
FIG. 1 is a schematic diagram showing an embodiment of an infrared sensor.

In this specification, a total solid content denotes the total mass of components of a composition excluding a solvent. In addition, a solid content denotes a solid content at 25° C.

In this specification, unless specified as a substituted group or as an unsubstituted group, a group (atomic group) denotes not only a group having no substituent but also a group having a substituent. For example, "alkyl group" denotes not only an alkyl group having no substituent (unsubstituted alkyl group) but also an alkyl group having a substituent (substituted alkyl group).

In this specification, "radiation" denotes, for example, a bright light spectrum of a mercury lamp, a far ultraviolet ray represented by excimer laser, an extreme ultraviolet ray (EUV ray), an X-ray, or an electron beam. In addition, in the present invention, "light" denotes an actinic ray or radiation. In this specification, unless specified otherwise, "exposure" denotes not only exposure using a mercury lamp, a far ultraviolet ray represented by excimer laser, an X-ray, an EUV ray, or the like but also drawing using a corpuscular beam such as an electron beam or an ion beam.

In this specification, infrared light denotes light (electromagnetic wave) in a wavelength range of 700 to 2500 nm.

In this specification, "(meth)acrylate" denotes either or both of acrylate and methacrylate, "(meth)acryl" denotes either or both of acryl and methacryl, and "(meth)acryloyl" denotes either or both of acryloyl and methacryloyl.

In this specification, in a chemical formula, Me represents a methyl group, Et represents an ethyl group, Pr represents a propyl group, Bu represents a butyl group, Ac represents an acetyl group, Bn represents a benzyl group, and Ph represents a phenyl group.

In this specification, the term "step" denotes not only an individual step but also a step which is not clearly distinguishable from another step as long as an effect expected from the step can be achieved.

In this specification, a weight-average molecular weight and a number-average molecular weight are defined as values in terms of polystyrene obtained by GPC. In this specification, an weight-average molecular weight (Mw) and a number-average molecular weight (Mn) can be obtained by using HLC-8220 (manufactured by Tosoh Corporation), using TSKgel Super AWM-H (manufactured by Tosoh Corporation; 6.0 mm ID (inner diameter)×15.0 cm) as a column, and using a 10 mmol/L lithium bromide N-methylpyrrolidinone (NMP) solution as an eluent.

<Curable Composition>

A curable composition according to the present invention includes: an α-type oxytitanium phthalocyanine pigment; and a curable compound.

The α-type oxytitanium phthalocyanine pigment has excellent light shielding properties to light at a wavelength of 850 nm and excellent transmittance to light at a wavelength of 940 nm. Further, the α-type oxytitanium phthalocyanine pigment also has excellent transmittance to light in a visible range (preferably a wavelength of 400 to 700 nm). Therefore, with the curable composition according to the present invention including the α-type oxytitanium phthalocyanine pigment, a film having excellent transmittance in a visible range and excellent light shielding properties to light in a wavelength range of 800 to 900 nm, a film having excellent light shielding properties to light in a wavelength range of 800 to 900 nm and excellent transmittance to light in a wavelength range of longer than 900 nm, or the like can be manufactured.

In addition, although the detailed reason is not clear, a film having excellent heat resistance can be obtained by using the α-type oxytitanium phthalocyanine pigment. In particular, by using the α-type oxytitanium phthalocyanine pigment in combination with a compound having an epoxy group, heat resistance can be further improved. The reason why heat resistance is improved is presumed to be that curing properties of a cured film are improved and movement and aggregation between particles of the α-type oxytitanium phthalocyanine pigment are suppressed by using the α-type oxytitanium phthalocyanine pigment in combination with a thermosetting compound.

Hereinafter, the respective components will be described.

<<Oxytitanium Phthalocyanine Pigment>>

The curable composition according to the present invention includes an α-type oxytitanium phthalocyanine pigment. An oxytitanium phthalocyanine pigment is a compound having an absorption in an infrared range, which is also an infrared absorber. In particular, the α-type oxytitanium phthalocyanine pigment has excellent transmittance in a visible range and excellent light shielding properties to light in a wavelength range of 800 to 900 nm (in particular, about 850 nm). Further, the α-type oxytitanium phthalocyanine pigment also has excellent transmittance to light in a wavelength range of longer than 900 nm.

The curable composition according to the present invention includes at least an oxytitanium phthalocyanine pigment (α-type oxytitanium phthalocyanine pigment) having an α-type crystal structure. The curable composition according to the present invention may include an oxytitanium phthalocyanine pigment (hereinafter, also referred to as "oxytitanium phthalocyanine pigment having another crystal structure") having a crystal structure (for example, a β-type or Y-type crystal structure) other than an α-type crystal structure.

In this specification, a mixture of the α-type oxytitanium phthalocyanine pigment and the oxytitanium phthalocyanine pigment having another crystal structure will be simply referred to as "oxytitanium phthalocyanine pigment".

The content of the α-type oxytitanium phthalocyanine pigment is preferably 50 mass % or higher, more preferably 70 mass % or higher, and still more preferably 90 mass % or higher with respect to the total mass of the oxytitanium phthalocyanine pigments.

The content of the oxytitanium phthalocyanine pigment having another crystal structure is preferably lower than 50 mass %, more preferably lower than 30 mass %, and still more preferably lower than 10 mass % with respect to the total mass of the oxytitanium phthalocyanine pigments. In addition, the curable composition does not include substantially oxytitanium phthalocyanine pigment having another crystal structure. The curable composition substantially not including the oxytitanium phthalocyanine pigment having another crystal structure represents that the content of the oxytitanium phthalocyanine pigment having another crystal structure is preferably 1 mass % or lower, more preferably 0.5 mass % or lower, and still more preferably 0.1 mass % or lower and may be 0 mass % with respect to the total mass of the oxytitanium phthalocyanine pigments.

The oxytitanium phthalocyanine pigment having an α-type crystal structure can be synthesized using a method described in paragraphs "0011" to "0054" of JP1999-126307A (JP-H11-21466A). The content is incorporated herein by reference.

The content of each of the crystal structure of the oxytitanium phthalocyanine pigment and other crystal structures can be measured by X-ray diffraction.

θ-2θ X-ray diffraction of the oxytitanium phthalocyanine pigment at 25° C. is performed using an X-ray diffractometer RINT-2500 (manufactured by Rigaku Corporation), the α-type oxytitanium phthalocyanine pigment shows clear peaks at Bragg angles (2θ±0.2°) of 7.6° and 28.6°. In addition, a β-type oxytitanium phthalocyanine pigment shows clear peaks at Bragg angles (2θ±0.2°) of 9.3° and 26.3°. In addition, a Y-type oxytitanium phthalocyanine pigment shows a clear peak at Bragg angles (2θ±0.2°) of 27.3°. θ is an angle between a lattice plane of a crystal lattice and an incident wave.

In addition, the content of the α-type oxytitanium phthalocyanine pigment in the oxytitanium phthalocyanine pigments can be measured with a calibration curve method using an X-ray diffractometer RINT-2500 (manufactured by Rigaku Corporation). The content of the oxytitanium phthalocyanine pigment having another crystal structure can also be measured using the same method as that of the α-type oxytitanium phthalocyanine pigment.

In the present invention, it is preferable that the α-type oxytitanium phthalocyanine pigment is a compound represented by the following Formula (1).

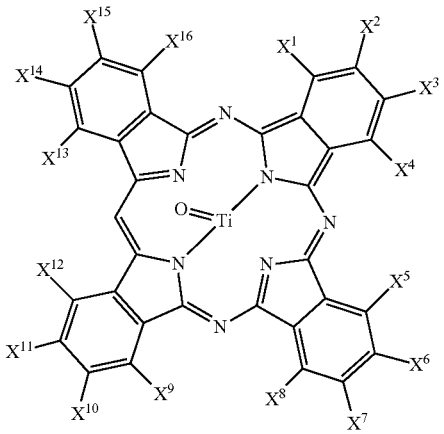

In the formula, $X^1$ to $X^{16}$ each independently represent a hydrogen atom or a halogen atom.

The number of halogen atoms among $X^1$ to $X^{16}$ is preferably 0 to 16, more preferably 0 to 4, still more preferably 0 or 1, and even still more preferably 0.

The content of the oxytitanium phthalocyanine pigment is preferably 1 to 70 mass % with respect to the total solid content of the curable composition. The lower limit is preferably 3 mass % or higher and more preferably 5 mass % or higher. The upper limit is preferably 60 mass % or lower, and more preferably 50 mass % or lower.

In addition, the content of the α-type oxytitaniumphthalocyanine pigment is preferably 1 to 70 mass % with respect to the total solid content of the curable composition. The lower limit is preferably 3 mass % or higher and more preferably 5 mass % or higher. The upper limit is preferably 60 mass % or lower, and more preferably 50 mass % or lower.

<<Other Infrared Absorbers>>

The curable composition according to the present invention may also include an infrared absorber (also referred to as "other infrared absorber") other than the oxytitanium phthalocyanine pigment.

The infrared absorber denotes a compound having an absorption in an infrared range (preferably a wavelength range of 650 to 1000 nm). It is preferable that the infrared absorber is a compound having a maximal absorption at a wavelength of 650 nm or longer. It is more preferable that the maximal absorption of the infrared absorber is present in a wavelength range of 650 to 1000 nm, it is still more preferable that the maximal absorption is present in a wavelength range of 700 to 1000 nm, and it is even still more preferable that the maximal absorption is present in a wavelength range of 800 to 1000 nm, Examples of the other infrared absorber include a pyrrolopyrrole compound, a copper compound, a cyanine compound, a phthalocyanine compound, a diimmonium compound, a thiol complex compound, a transition metal oxide compound, a squarylium compound, a naphthalocyanine compound, a quaterrylene compound, a dithiol metal complex compound, a croconium compound, and an oxole compound.

As the phthalocyanine compound, the naphthalocyanine compound, the diimmonium compound, the cyanine compound, the squarylium compound, or the croconium compound, for example, one of compounds described in paragraphs "0010" to "0081" of JP2010-111750A may be used, the content of which are incorporated in this specification. The cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

Examples of the pyrrolopyrrole compound include a compound described in paragraphs "0049" to "0058" of JP2009-263614A, the content of which is incorporated herein by reference.

In a case where the curable composition according to the present invention includes the other infrared absorber, the content of the other infrared absorber is preferably 0.1 to 50 parts by mass, more preferably 0.5 to 30 parts by mass, and still more preferably 1.0 to 15 parts by mass with respect to 100 parts by mass of the oxytitanium phthalocyanine pigment.

In addition, the curable composition may also not substantially include the other infrared absorber. The curable composition substantially not including the other infrared absorber represent that, for example, the content of the other infrared absorber is preferably 0.1 parts by mass or lower, more preferably 0.05 parts by mass or lower, still more preferably 0.01 parts by mass or lower, and even still more preferably 0 parts by mass or lower with respect to 100 parts by mass of the oxytitanium phthalocyanine pigment.

<<Chromatic Colorant>>

The curable composition according to the present invention may also include a chromatic colorant as an colorant other than the α-type oxytitanium phthalocyanine pigment. In a case where the curable composition according to the present invention is used as, for example, a composition for forming an infrared cut filter, an infrared cut filter having a function as a color filter can be obtained by the curable composition according to the present invention further including a chromatic colorant. In the present invention, "infrared cut filter" refers to a filter that allows transmission of light (visible light) in the visible range and shields light (infrared light) in the infrared range. The infrared cut filter may be a filter that allows transmission of light in the entire wavelength range of the visible range, or may be a filter that allows transmission of light in a specific wavelength range of the visible range and shields light in another specific wavelength range of the visible range. In addition, in the present invention, "color filter" refers to a filter that allows transmission of light in a specific wavelength range of the visible range and shields light in another specific wavelength range of the visible range.

In the present invention, "chromatic colorant" denotes a colorant other than a white colorant and a black colorant. It is preferable that the chromatic colorant is a colorant having a maximal absorption in a wavelength range of 400 nm or longer and shorter than 650 nm.

In the present invention, the chromatic colorant may be a pigment or a dye.

It is preferable that an average particle size (r) of the pigment satisfies preferably 20 nm≤r≤300 nm, more preferably 25 nm≤r≤250 nm, and still more preferably 30 nm≤r≤200 nm. "Average particle size" described herein denotes the average particle size of secondary particles which are aggregates of primary particles of the pigment.

In addition, regarding a particle size distribution of the secondary particles of the pigment (hereinafter, simply referred to as "particle size distribution") which can be used, it is preferable that secondary particles having a particle size of (average particle size±100) nm account for 70 mass % or higher, preferably, 80 mass % or higher in the pigment. The particle size distribution of the secondary particles can be measured using a scattering intensity distribution.

The average particle size of primary particles can be obtained by observing a pigment with a scanning electron microscope (SEM) or a transmission electron microscope (TEM), measuring particle sizes of 100 particles in a region where particles do not aggregate, and obtaining an average value of the measured particle sizes.

The pigment is preferably an organic pigment, and examples thereof are as follows. However, the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

In addition, as the dye, an acid dye and/or a derivative thereof may be suitably used.

Furthermore, for example, a direct dye, a basic dye, a mordant dye, an acid mordant dye, an azoic dye, a dispersed dye, an oil-soluble dye, a food dye, and/or a derivative thereof can be suitably used.

Specific examples of the acid dye are shown below, but the present invention is not limited to these examples. For example, the following dyes and derivatives thereof can be used:

acid alizarin violet N;

acid blue 1, 7, 9, 15, 18, 23, 25, 27, 29, 40 to 45, 62, 70, 74, 80, 83, 86, 87, 90, 92, 103, 112, 113, 120, 129, 138, 147, 158, 171, 182, 192, 243, and 324:1;

acid chrome violet K;

acid Fuchsin and acid green 1, 3, 5, 9, 16, 25, 27, and 50;

acid orange 6, 7, 8, 10, 12, 50, 51, 52, 56, 63, 74, and 95;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266, and 274;

acid violet 6B, 7, 9, 17, and 19; and acid yellow 1, 3, 7, 9, 11, 17, 23, 25, 29, 34, 36, 42, 54, 72, 73, 76, 79, 98, 99, 111, 112, 114, 116, 184, and 243 and Food Yellow 3.

In addition to the above-described examples, an azo acid dye, a xanthene acid dye, and a phthalocyanine acid dye are preferably used, and acid dyes, such as C.I. Solvent Blue 44 and 38, C.I. Solvent Orange 45, Rhodamine B, and Rhodamine 110 and derivatives of the dyes are also preferably used.

Among these, it is preferable that the dye is a colorant selected from the group consisting of a triarylmethane dye, an anthraquinone dye, an azomethine dye, a benzylidene dye, an oxonol dye, a cyanine dye, a phenothiazine dye, a pyrrolopyrazole azo methine dye, a xanthene dye, a phthalocyanine dye, a benzopyran dye, an indigo dye, a pyrazole azo dye, an anilino azo dye, a pyrazolotriazole azo dye, a pyridone azo dye, an anthrapyridone dye, and a pyrromethene dye.

Further, a combination of a pigment and a dye may be used.

In a case where the curable composition according to the present invention includes a chromatic colorant, it is preferable that the content of the chromatic colorant is 0.01 to 70 mass % with respect to the total solid content of the curable composition according to the present invention. The lower limit is preferably 0.1 mass % or higher and more preferably 0.5 mass % or higher. The upper limit is preferably 60 mass % or lower, and more preferably 50 mass % or lower.

The content of the chromatic colorant is preferably 10 to 1000 parts by mass and more preferably 50 to 800 parts by mass with respect to 100 parts by mass of the total content of the oxytitanium phthalocyanine pigment and the other infrared absorber.

In addition, it is preferable that the total content of the oxytitanium phthalocyanine pigment, the other infrared absorber, and the chromatic colorant is 1 to 70 mass % with respect to the total solid content of the curable composition according to the present invention. The lower limit is preferably 3 mass % or higher and more preferably 5 mass % or higher. The upper limit is preferably 60 mass % or lower, and more preferably 50 mass % or lower.

In addition, the curable composition according to the present invention may not substantially include a chromatic colorant. The curable composition substantially not including the chromatic colorant represent that the content of the chromatic colorant is preferably 0.005 mass % or lower, more preferably 0.001 mass % or lower, and still more preferably 0% with respect to the total solid content of the curable composition according to the present invention.

<<Coloring Material that Shields Visible Light>>

The curable composition according to the present invention may include a coloring material that shields visible light. For example, the curable composition can be preferably used as a composition for forming an infrared transmitting filter. In addition, in the present invention, "infrared transmitting filter" refers to a filter that shields light (visible light) in the visible range and allows transmission of light (infrared light) in the infrared range.

In addition, it is preferable that black, gray, or a color similar to black or gray is exhibited using a combination of a plurality of coloring materials that shields visible light.

In addition, it is preferable that the coloring material that shields visible light is a material that absorbs light in a wavelength range of violet to red.

In addition, it is preferable that the coloring material that shields visible light is a material that shields light in a wavelength range of 450 to 650 nm.

In the present invention, it is preferable that the coloring material that shields visible light satisfies at least one of the following requirement (1) or (2), and it is more preferable that the coloring material that shields visible light satisfies the requirement (1).

(1): An aspect in which the coloring material that shields visible light includes two or more chromatic colorants (2): An aspect in which the coloring material that shields visible light includes an organic black colorant In addition, in the present invention, the organic black colorant as the coloring material that shields visible light denotes a material that absorbs visible light and allows at least a part of infrared light. Accordingly, in the present invention, the organic black colorant as the coloring material that shields visible light does not denote a black colorant that absorbs both visible light and infrared light, for example, carbon black or titanium black.

Examples of the chromatic colorant are as described above.

Examples of the organic black colorant include a bisbenzofuranone compound, an azomethine compound, a perylene compound, and an azo compound. Among these, a bisbenzofuranone compound or a perylene compound is preferable.

Examples of the bisbenzofuranone compound include compounds described in JP2010-534726A, JP2012-515233A, and JP2012-515234A. For example, "Irgaphor Black" (manufactured by BASF SE) is available.

Examples of the perylene compound include C.I. Pigment Black 31 and 32.

Examples of the azomethine compound include compounds described in JP1989-170601A (JP-H1-170601A) and JP1990-34664A (JP-H2-34664A). For example, "CHROMOFINE BLACK A1103" (manufactured by Dainichiseika Color & Chemicals Mfg. Co., Ltd.) is available.

The azo compound is not particularly limited, and for example, a compound represented by the following Formula (A-1) can be suitably used.

A-1

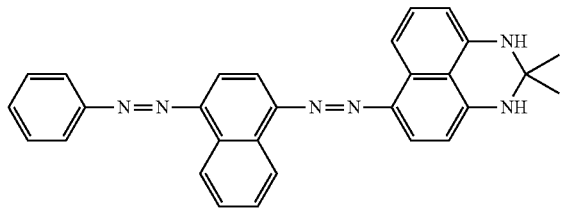

In the present invention, it is preferable that the bisbenzofuranone compound is one of the following compounds represented by the following formulae or a mixture thereof.

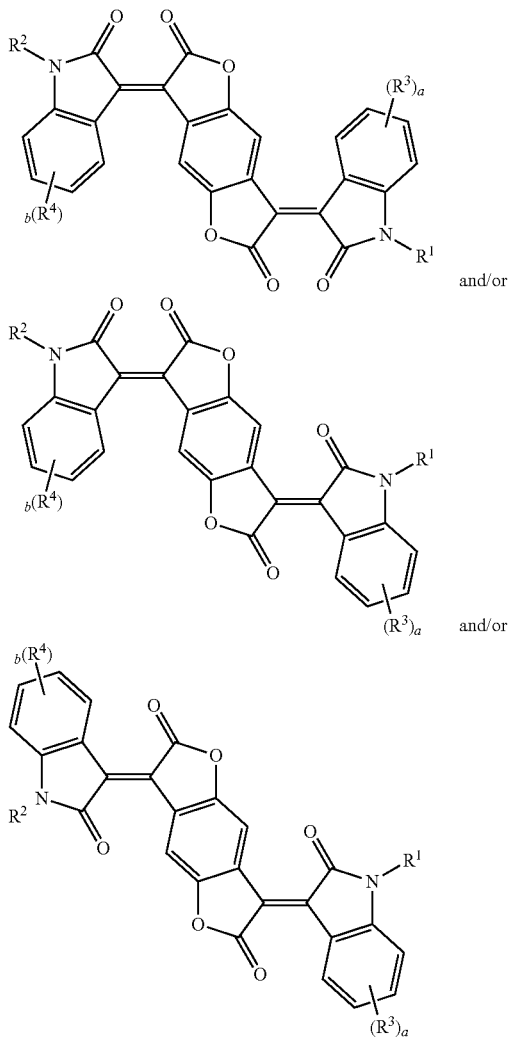

In the formulae, $R^1$ and $R^2$ each independently represent a hydrogen atom or a substituent, $R^3$ and $R^4$ each independently represent a substituent, a and b each independently represent an integer of 0 to 4, in a case where a is 2 or more, a plurality of $R^3$'s may be the same as or different from each other, a plurality of $R^3$'s may be bonded to each other to form a ring, in a case where b is 2 or more, a plurality of $R^4$'s may be the same as or different from each other, and a plurality of $R^4$'s may be bonded to each other to form a ring.

The substituent represented by $R^1$ to $R^4$ is a halogen atom, a cyano group, a nitro group, an alkyl group, an alkenyl group, an alkynyl group, an aralkyl group, an aryl group, a heteroaryl group, —$OR^{301}$, —$COR^{302}$, —$COOR^{303}$, —$OCOR^{304}$, —$NR^{305}R^{306}$—, —$NHCOR^{307}$, —$CONR^{308}R^{309}$, —$NHCONR^{310}R^{311}$, —$NHCOOR^{312}$, —$SR^{313}$, —$SO_2R^{314}$, —$SO_2OR^{315}$, —$NHSO_2R^{316}$, or —$SO_2NR^{317}R^{318}$. $R^{301}$ to $R^{318}$ each independently represent a hydrogen atom, an alkyl group, an alkenyl group, an alkynyl group, an aryl group, or a heteroaryl group.

Examples of the halogen atom include a fluorine atom, a chlorine atom, a bromine atom, and an iodine atom.

The number of carbon atoms in the alkyl group is preferably 1 to 12. The alkyl group may be linear, branched, or cyclic.

The number of carbon atoms in the alkenyl group is preferably 2 to 12. The alkenyl group may be linear, branched, or cyclic.

The number of carbon atoms in the alkynyl group is preferably 2 to 12. The alkynyl group may be linear, branched, or cyclic.

The number of carbon atoms in the aryl group is preferably 6 to 12.

The number of carbon atoms in the alkyl group is preferably 1 to 20, more preferably 1 to 12, and still more preferably 1 to 8. The alkyl group may be linear, branched, or cyclic.

The number of carbon atoms in the alkenyl group is preferably 2 to 20, more preferably 2 to 12, and still more preferably 2 to 8. The alkenyl group may be linear, branched, or cyclic.

The number of carbon atoms in the alkynyl group is preferably 2 to 20, more preferably 2 to 12, and still more preferably 2 to 8. The alkynyl group may be linear, branched, or cyclic.

The number of carbon atoms in the aryl group is preferably 6 to 25, more preferably 6 to 15, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5- or 6-membered ring. It is preferable that the heteroaryl group is a 5- or 6-membered ring. The number of carbon atoms constituting the ring of the heteroaryl group is preferably 3 to 30, more preferably 3 to 18, and still more preferably 3 to 12.

The details of the bisbenzofuranone compound can be found in paragraphs "0014" to "0037" of JP2010-534726A, the content of which is incorporated herein by reference.

In the present invention, it is preferable that the coloring material that shields visible light is a material in which a ratio AB of a minimum value A of an absorbance in a wavelength range of 450 to 650 nm to a maximum value B of an absorbance in a wavelength range of 900 to 1300 nm is 4.5 or higher.

The above-described characteristics may be satisfied using one material alone or using a combination of a plurality of materials. For example, in the aspect (1), it is preferable that the spectral characteristics are satisfied using a combination of a plurality of chromatic colorants.

In a case where the coloring material that shields visible light includes two or more chromatic colorants, the chromatic colorants are selected from the group consisting of a red colorant, a green colorant, a blue colorant, a yellow colorant, a violet colorant, and an orange colorant.

In a case where the coloring material that shields visible light is formed using a combination of two or more chromatic colorants, examples of the combination of chromatic colorants are as follows.

(1) An aspect in which the coloring material that shields visible light includes a yellow colorant, a blue colorant, a violet colorant, and a red colorant (2) An aspect in which the coloring material that shields visible light includes a yellow colorant, a blue colorant, and a red colorant (3) An aspect in which the coloring material that shields visible light includes a yellow colorant, a violet colorant, and a red colorant (4) An aspect in which the coloring material that shields visible light includes a yellow colorant and a violet colorant (5) An aspect in which the coloring material that shields visible light includes a green colorant, a blue colorant, a violet colorant, and a red colorant (6) An aspect in which the coloring material that shields visible light includes a violet colorant and an orange colorant (7) An aspect in which the coloring material that shields visible light includes a green colorant, a violet colorant, and a red colorant (8) An aspect in which the coloring material that shields visible light includes a green colorant and a red colorant Specific examples of the aspect (1) include C.I. Pigment Yellow 139 or 185 as a yellow pigment, C.I. Pigment Blue 15:6 as a blue pigment, C.I. Pigment Violet 23 as a violet pigment, and C.I. Pigment Red 254 or 224 as a red pigment.

Specific examples of the aspect (2) include C.I. Pigment Yellow 139 or 185 as a yellow pigment, C.I. Pigment Blue 15:6 as a blue pigment, and C.I. Pigment Red 254 or 224 as a red pigment.

Specific examples of the aspect (3) include C.I. Pigment Yellow 139 or 185 as a yellow pigment, C.I. Pigment Violet 23 as a violet pigment, and C.I. Pigment Red 254 or 224 as a red pigment.

Specific examples of the aspect (4) include C.I. Pigment Yellow 139 or 185 as a yellow pigment, and C.I. Pigment Violet 23 as a violet pigment.

Specific examples of the aspect (5) include C.I. Pigment Green 7 or 36 as a green pigment, C.I. Pigment Blue 15:6 as a blue pigment, C.I. Pigment Violet 23 as a violet pigment, and C.I. Pigment Red 254 or 224 as a red pigment.

Specific examples of the aspect (6) include C.I. Pigment Violet 23 as a violet pigment, and C.I. Pigment Orange 71 as an orange pigment.

Specific examples of the aspect (7) include C.I. Pigment Green 7 or 36 as a green pigment, C.I. Pigment Violet 23 as a violet pigment, and C.I. Pigment Red 254 or 224 as a red pigment.

Specific examples of the aspect (8) include C.I. Pigment Green 7 or 36 as a green pigment, and C.I. Pigment Red 254 or 224 as a red pigment.

For example, ratios (mass ratios) between the respective colorants are as follows.

TABLE 1

| No. | Yellow Colorant | Green Colorant | Blue Colorant | Violet Colorant | Red Colorant | Orange Colorant |
|---|---|---|---|---|---|---|
| 1 | 0.1 to 0.4 | | 0.1 to 0.6 | 0.01 to 0.3 | 0.1 to 0.6 | |
| 2 | 0.1 to 0.4 | | 0.1 to 0.6 | | 0.2 to 0.7 | |
| 3 | 0.1 to 0.6 | | | 0.1 to 0.6 | 0.1 to 0.6 | |
| 4 | 0.2 to 0.8 | | | 0.2 to 0.8 | | |
| 5 | | 0.1 to 0.4 | 0.1 to 0.4 | 0.1 to 0.4 | 0.1 to 0.4 | |
| 6 | | | | 0.2 to 0.6 | | 0.4 to 0.8 |
| 7 | | 0.1 to 0.5 | | 0.2 to 0.7 | 0.1 to 0.4 | |
| 8 | | 0.5 to 0.8 | | | 0.2 to 0.5 | |

In a case where the curable composition according to the present invention includes a coloring material that shields visible light, it is preferable that the content of the coloring material that shields visible light is 0.01 to 70 mass % with respect to the total solid content of the curable composition according to the present invention. The lower limit is preferably 0.1 mass % or higher and more preferably 0.5 mass % or higher. The upper limit is preferably 60 mass % or lower, and more preferably 50 mass % or lower.

The content of the coloring material that shields visible light is preferably 10 to 1000 parts by mass and more preferably 50 to 800 parts by mass with respect to 100 parts by mass of the total content of the oxytitanium phthalocyanine pigment and the other infrared absorber.

In addition, it is preferable that the total content of the oxytitanium phthalocyanine pigment, the other infrared absorber, and the coloring material that shields visible light is 1 to 70 mass % with respect to the total solid content of the curable composition according to the present invention. The lower limit is preferably 3 mass % or higher and more preferably 5 mass % or higher. The upper limit is preferably 60 mass % or lower, and more preferably 50 mass % or lower.

In a case where the curable composition according to the present invention includes a coloring material that shields visible light, regarding the spectral characteristics of the curable composition, it is preferable that a ratio A/B of a minimum value A of an absorbance in a wavelength range of 400 to 830 nm to a maximum value B of an absorbance in a wavelength range of 1000 to 1300 nm is 4.5 or higher. The above-described ratio A/B is preferably 10 or higher, more preferably 15 or higher, and still more preferably 30 or higher.

In a case where the absorbance ratio is 4.5 or higher, a film having spectral characteristics in which a maximum value of a light transmittance of the film in a thickness direction in a wavelength range of 400 to 830 nm is 20% or lower and in which a minimum value of a light transmittance of the film in the thickness direction in a wavelength range of 1000 to 1300 nm is 70% or higher can be suitably formed. Therefore, this film is suitable as an infrared transmitting filter.

An absorbance $A\lambda$ at a wavelength $\lambda$ is defined by the following Expression (1).

$$A\lambda = -\log(T\lambda) \quad (1)$$

$A\lambda$ represents the absorbance at the wavelength $\lambda$, and $T\lambda$ represents a transmittance at the wavelength $\lambda$.

In the present invention, a value of the absorbance may be a value measured in the form of a solution or a value of a film which is formed using the curable composition. In a case where the absorbance is measured in the form of the film, it is preferable that the film is formed by applying the curable composition to a glass substrate using a method such as spin coating such that the thickness of the dried film is a predetermined value, and drying the applied curable composition on a hot plate at 100° C. for 120 seconds. The thickness of the film can be obtained by measuring the thickness of the substrate including the film using a stylus surface profilometer (DEKTAK 150, manufactured by ULVAC Inc.).

In addition, the absorbance can be measured using a well-known spectrophotometer of the related art. Measurement conditions of the absorbance are not particularly limited. It is preferable that the maximum value B of the absorbance in a wavelength range of 1000 to 1300 nm is measured under conditions which are adjusted such that the minimum value A of the absorbance in a wavelength range of 400 to 830 nm is 0.1 to 3.0. By measuring the absorbance under the above-described conditions, a measurement error can be further reduced. A method of adjusting the minimum value A of the absorbance in a wavelength range of 400 to 830 nm to be 0.1 to 3.0 is not particularly limited. For example, in a case where the absorbance is measured in the form of the curable composition, for example, a method of adjusting the optical path length of a sample cell can be used. In addition, in a case where the absorbance is measured in the form of the film, for example, a method of adjusting the thickness of the film can be used.

A method of measuring the spectral characteristics and the thickness of the film formed using the curable composition according to the present invention is as follows.

The curable composition according to the present invention is applied to a glass substrate using a method such as spin coating such that the thickness of the dried film is a predetermined value and then is dried on a hot plate at 100° C. for 120 seconds.

The thickness of the film is obtained by measuring the thickness of the dried substrate including the film using a stylus surface profilometer (DEKTAK 150, manufactured by ULVAC Inc.).

The transmittance of the dried substrate including the film is measured in a wavelength range of 300 to 1300 nm using a spectrophotometer of an ultraviolet-visible-near infrared spectrophotometer (U-4100, manufactured by Hitachi High-Technologies Corporation).

<<Pigment Derivative>>

The curable composition according to the present invention may include a pigment derivative. Examples of the pigment derivative include a compound having a structure in which a portion of a pigment is substituted with an acidic group, a basic group, or a phthalimidomethyl group. It is preferable that the pigment derivative has an acidic group or a basic group from the viewpoints of dispersibility and dispersion stability.

Examples of an organic pigment for forming the pigment derivative include a pyrrolopyrrole pigment, a diketo pyrrolo pyrrole pigment, an azo pigment, a phthalocyanine pigment, an anthraquinone pigment, a quinacridone pigment, a dioxazine pigment, a perinone pigment, a perylene pigment, a thioindigo pigment, an isoindoline pigment, an isoindolinone pigment, a quinophthalone pigment, a threne pigment, and a metal complex pigment.

In addition, as the acidic group included in the pigment derivative, a sulfonic acid, a carboxylic acid, or a quaternary ammonium salt thereof is preferable, a carboxylate group or a sulfonate group is more preferable, and a sulfonate group is still more preferable. As the basic group included in the pigment derivative, an amino group is preferable, and a tertiary amino group is more preferable.

As the pigment derivative, a pyrrolopyrrole pigment derivative, a quinoline pigment derivative, a benzimidazolone pigment derivative, or an isoindoline pigment derivative, is preferable, and a pyrrolopyrrole pigment derivative is more preferable.

The content of the pigment derivative is preferably 1 to 50 mass % and more preferably 3 to 30 mass % with respect to the total mass of the pigments. Among these pigment derivatives, one kind may be used alone, or two or more kinds may be used in combination.

<<Curable Compound>>

The curable composition according to the present invention includes a curable compound. As the curable compound, a well-known compound which is crosslinkable by a radical, an acid, or heat can be used. Examples of the compound include a compound having a radically polymerizable group, a cyclic ether (epoxy, oxetane) group, or a methylol group. Examples of the radically polymerizable group include an ethylenically unsaturated bond such as a vinyl group, a (meth)allyl group, or a (meth)acryloyl group.

In the present invention, the curable compound is preferably a polymerizable compound and more preferably a photoradically polymerizable compound.

The content of the curable compound is preferably 0.1 to 50 mass % with respect to the total solid content of the composition. For example, the lower limit is preferably 0.5 mass % or higher and more preferably 1 mass % or higher. For example, the upper limit is more preferably 45 mass % or lower and still more preferably 40 mass % or lower. As the curable compound, one kind may be used alone, or two or more kinds may be used in combination. In a case where two or more curable compounds are used in combination, it is preferable that the total content of the two or more curable compounds is in the above-described range.

(Polymerizable Compound)

In the present invention, the polymerizable compound may have any chemical form such as a monomer, a prepolymer, that is, a dimer, a trimer, or an oligomer, or a mixture or polymer thereof. In a case where the polymerizable compound is a photoradically polymerizable compound, a monomer is preferable.

The molecular weight of the polymerizable compound is preferably 100 to 3000. The upper limit is preferably 2000 or lower and more preferably 1500 or lower. The lower limit is preferably 150 or higher and more preferably 250 or higher.

The polymerizable compound is preferably a (meth)acrylate compound having 3 to 15 functional groups and more preferably a (meth)acrylate compound having 3 to 6 functional groups. Examples of the polymerizable compound include compounds described in paragraphs "0095" to "0108" of JP2009-288705A, paragraph "0227" of JP2013-29760 and paragraphs "0254" to "0257" of JP2008-292970A, the content of which is incorporated herein by reference.

As the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd., A-DPH-12E as a commercially available product;

As the polymerizable compound, a polymerizable compound having an alkyleneoxy group may also be used. As the polymerizable compound having an alkyleneoxy group, a polymerizable compound having an ethyleneoxy group and/or a propyleneoxy group is preferable, a polymerizable compound having an ethyleneoxy group is more preferable, and a trifunctional to hexafunctional (meth)acrylate compound having 4 to 20 ethyleneoxy groups is still more preferable.

Specific examples of the polymerizable compound having an alkyleneoxy group include the following compounds.

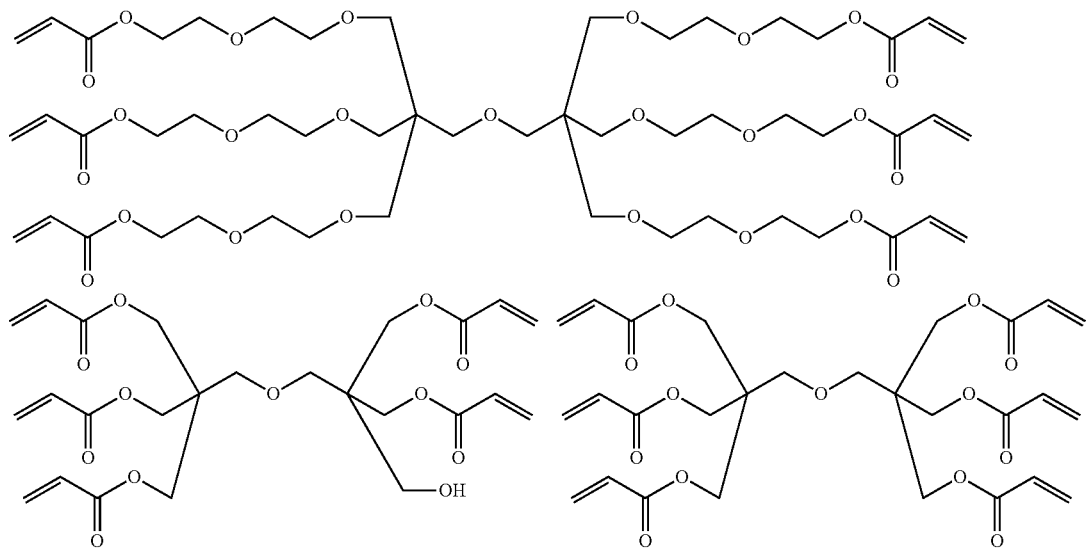

manufactured by Shin-Nakamura Chemical Co., Ltd.), and a structure (for example, SR454 or SR499; manufactured by Sartomer) in which these (meth)acryloyl group is bonded through an ethylene glycol or a propylene glycol residue is preferable. Oligomers of the above-described examples can be used. In addition, KAYARAD RP-1040 or DPCA-20 (manufactured by Nippon Kayaku Co., Ltd.) can also be used.

The polymerizable compound may have an acid group such as a carboxyl group, a sulfonate group, or a phosphate group. Examples of a commercially available product of the monomer having an acid group include M-305, M-510, and M-520 as polybasic acid-modified acrylic oligomer (manufactured by Toagosei Co., Ltd.).

The acid value of the polymerizable compound having an acid group is preferably 0.1 to 40 mgKOH/g and more preferably 5 to 30 mgKOH/g. In a case where the acid value of the polymerizable compound is 0.1 mgKOH/g or higher, development solubility is excellent. In a case where the acid value of the polymerizable compound is 40 mgKOH/g or lower, there are advantageous effects in manufacturing and handleability. Further, photopolymerization performance is excellent, and curing properties are excellent.

In addition, a compound having a caprolactone structure is also preferable as the polymerizable compound.

As the polymerizable compound having a caprolactone structure, for example, KAYARAD DPCA series (manufactured by manufactured by Nippon Kayaku Co., Ltd.) is commercially available, and examples thereof include DPCA-20, DPCA-30, DPCA-60, and DPCA-120.

Examples of a commercially available product of the polymerizable compound having an alkyleneoxy group include SR-494 (manufactured by Sartomer) which is a tetrafunctional acrylate having four ethyleneoxy groups, DPCA-60 (manufactured by Nippon Kayaku Co., Ltd.) which is a hexafunctional acrylate having six pentyleneoxy groups, and TPA-330 (manufactured by Nippon Kayaku Co., Ltd.) which is a trifunctional acrylate having three isobutyleneoxy groups.

As the polymerizable compound, a urethane acrylate described in JP1973-41708B (JP-S48-41708B), JP1976-37193A (JP-S51-37193A), JP1990-32293B (JP-H2-32293B), or JP1990-16765B (JP-H2-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, a curable composition having an excellent film speed can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600 and AI-600 (manufactured by Kyoeisha Chemical Co., Ltd.).

In a case where a polymerizable compound is used as the curable compound, the content of the polymerizable compound is preferably 0.1 to 50 mass % with respect to the total solid content of the composition. For example, the lower limit is preferably 0.5 mass % or higher and more preferably 1 mass % or higher. For example, the upper limit is more preferably 45 mass % or lower and still more preferably 40 mass % or lower. As the curable compound, one kind may be used alone, or two or more kinds may be used in combination. In a case where two or more curable compounds are used in combination, it is preferable that the total content of the two or more curable compounds is in the above-described range.

In addition, the content of the polymerizable compound is preferably 10 to 100 mass % and more preferably 30 to 100 mass % with respect to the total mass of the curable compound.

(Compound Having Epoxy Group)

In the present invention, as the curable compound, a compound having an epoxy group can also be used. By using the compound having an epoxy group in combination with the α-type oxytitanium phthalocyanine pigment, heat resistance of a film can be further improved.

In the present invention, as the compound having an epoxy group, a compound having two or more epoxy groups in one molecule is preferable. By using the compound having two or more epoxy groups in one molecule, the effects of the present invention can be more effectively achieved. The number of epoxy groups in one molecule is preferably 2 to 100. The upper limit is, for example, 10 or less or 5 or less.

In the present invention, it is preferable that the compound having an epoxy group has a structure having an aromatic ring and/or an aliphatic ring, and it is more preferable that the compound having an epoxy group has a structure having an aliphatic ring. It is preferable that the epoxy group is bonded to the aromatic ring and/or the aliphatic ring through a single bond or a linking group. Examples of the linking group include an alkylene group, an arylene group, —O—, a structure represented by —NR'— (R' represents a hydrogen atom, an alkyl group which may have a substituent, or an aryl group which may have a substituent and preferably represents a hydrogen atom), and a group having at least one selected from —SO$_2$—, —CO—, —O—, and —S—.

In the case of the compound having an aliphatic ring, it is preferable that the epoxy group is directly bonded (single bond) to the aliphatic ring. In the case of the compound having an aromatic ring, it is preferable that the epoxy group is bonded to the aromatic ring through a linking group. As the linking group, an alkylene group, or a group including a combination of an alkylene group and —O— is preferable.

In addition, as the compound having an epoxy group, a compound having a structure in which two or more aromatic rings are linked through a hydrocarbon group can be preferably used. As the hydrocarbon group, an alkylene group having 1 to 6 carbon atoms is preferable. In addition, it is preferable that the epoxy groups are linked to each other through the linking group.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecule weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 3000 or lower, more preferably 2000 or lower, and still more preferably 1500 or lower.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference. Regarding the commercially available product, examples of the bisphenol A epoxy resin include jER825, jER827, jER828, jER834, jER1001, jER1002, jER1003, jER1055, jER1007, jER1009, and jER1010 (all of which are manufactured by Mitsubishi Chemical Corporation) and EPICLON860, EPICLON1050, EPICLON1051, and EPICLON1055 (all of which are manufactured by DIC Corporation). Examples of the bisphenol F epoxy resin include jER806, jER807, jER4004, jER4005, jER4007, and jER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include jER152, jER154, jER157S70, and jER157S65 (all of which are manufactured by Mitsubishi Chemical Corporation) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPO-LEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), and jER1031S (manufactured by Mitsubishi Chemical Corporation).

In a case where a compound having an epoxy group is used as the curable compound, the content of the compound having an epoxy group is preferably 0.1 to 40 mass % with respect to the total solid content of the composition. For example, the lower limit is preferably 0.5 mass % or higher and more preferably 1 mass % or higher. For example, the upper limit is more preferably 30 mass % or lower and still more preferably 20 mass % or lower. As the compound having an epoxy group, one kind may be used alone, or two or more kinds may be used in combination. In a case where two or more compounds having an epoxy group are used in combination, it is preferable that the total content of the two or more compounds having an epoxy group is in the above-described range.

In addition, the content of the compound having an epoxy group is preferably 1 to 80 mass % and more preferably 1 to 50 mass % with respect to the total mass of the curable compound.

In addition, in a case where the polymerizable compound and the compound having an epoxy group are used in combination, a mass ratio of the polymerizable compound to the compound having an epoxy group is preferably 100:1 to 100:400 and more preferably 100:1 to 100:100.

<<Photopolymerization Initiator>>

It is preferable that the curable composition according to the present invention includes a photopolymerization initiator.

The photopolymerization initiator is not particularly limited as long as it has an ability to initiate the polymerization of the polymerizable compound, and can be selected from well-known photopolymerization initiators. For example, a photopolymerization initiator having photosensitivity to light in a range from the ultraviolet range to the visible range is preferable. In addition, the photopolymerization initiator may be an activator which causes an action with a photo-excited sensitizer to generate active radicals, or may be an initiator which initiates cationic polymerization depending on the kinds of monomers.

In a case where a radically polymerizable compound is used as the polymerizable compound, it is preferable that the photopolymerization initiator is a photoradical polymerization initiator.

In addition, it is preferable that the photopolymerization initiator is at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable.

Among these, a trihalomethyltriazine compound, an α-aminoketone compound, an acylphosphine compound, a phosphine oxide compound, an oxime compound, a triarylimidazole dimer, an onium compound, a benzophenone compound, or an aminoacetophenone compound is more preferable, and at least one compound selected from the group consisting of a trihalomethyltriazine compound, an α-amino ketone compound, an oxime compound, a triarylimidazole dimer, and a benzophenone compound is still more preferable.

In particular, in a case where the film according to the present invention is used for a solid image pickup element, it is necessary to form a fine pattern in a sharp shape, and thus it is important to obtain excellent curing properties and perform development without a residue remaining in a non-exposed portion. From these viewpoints, it is more preferable that an oxime compound is used as the photopolymerization initiator. In particular, in a case where a fine pattern is formed in a solid image pickup element, a stepper is used for exposure for curing, and this exposure device may be damaged by halogen, and it is also necessary to reduce the addition amount of the photopolymerization initiator to be small. Therefore, in consideration of this point, it is more preferable that an oxime compound is used as the photopolymerization initiator for forming a fine pattern in a solid image pickup element or the like. In addition, by using the oxime compound, a film having excellent curing properties can be formed, and color transfer properties can be further improved.

Examples of the photopolymerization initiator can be found in paragraphs "0265" to "0268" of JP2013-29760A, the content of which is incorporated herein by reference.

As the photopolymerization initiator, a hydroxyacetophenone compound, an aminoacetophenone compound, or an acylphosphine compound can also be preferably used. More specifically, for example, an aminoacetophenone initiator described in JP1998-291969A (JP-H10-291969A) or an acylphosphine initiator described in JP4225898B can also be used.

As the hydroxyacetophenone initiator, for example, IRGACURE-184, DAROCUR-1173, IRGACURE-500, IRGACURE-2959, or IRAGACURE-127 (trade name, all of which are manufactured by BASF SE) can be used.

As the aminoacetophenone initiator, IRGACURE-907, IRGACURE-369, or IRGACURE-379EG (trade name, all of which are manufactured by BASF SE) which is a commercially available product can be used. As the aminoacetophenone initiator, a compound described in JP2009-191179A whose absorption wavelength is adjusted to match with that of a light source having a long wavelength of, for example, 365 nm or 405 nm can also be used.

As the acylphosphine initiator, IRGACURE-819, or DAROCUR-TPO (trade name, all of which are manufactured by BASF SE) which is a commercially available product can be used.

As the photopolymerization initiator, for example, an oxime compound is more preferable.

Specific examples of the oxime compound include a compound described in JP2001-233842A, a compound described in JP2000-80068A, and a compound described in JP2006-342166A.

Examples of the oxime compound which can be preferably used in the present invention include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

In addition, examples of the oxime compound include a compound described in J. C. S. Perkin II (1979), pp. 1653-1660, J. C. S. Perkin II (1979), pp. 156-162 and Journal of Photopolymer Science and Technology (1995), pp. 202-232, or JP2000-66385A; and a compound described in JP2000-80068A, JP2004-534797A, or JP2006-342166A.

As a commercially available product of the oxime compound, IRGACURE-OXE01 (manufactured by BASF SE) and IRGACURE-OXE02 (manufactured by BASF SE) can also be preferably used. In addition, TR-PBG-304 (manufactured by Changzhou Tronly New Electronic Materials Co., Ltd.), and ADEKA ARKLS NCI-831 and ADEKA ARKLS NCI-930 (all of which are manufactured by Adeka Corporation) can also be used.

In addition, in addition to the above-described oxime compounds, for example, a compound described in JP2009-519904A in which oxime is linked to a N-position of carbazole, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having a maximal absorption at 405 nm and having excellent sensitivity to a light source of g-rays, or a compound described in paragraphs "0076" to "0079" of JP2014-137466A may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

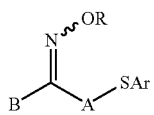
(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

The oxime compound preferably has a maximal absorption in a wavelength range of 350 µm to 500 nm, more preferably has an absorption wavelength in a wavelength range of 360 nm to 480 nm, and still more preferably has a high absorbance at 365 nm and 405 nm.

The molar absorption coefficient of the oxime compound at 365 nm or 405 nm is preferably 1000 to 300000, more preferably 2000 to 300000, and still more preferably 5000 to 200000 from the viewpoint of sensitivity.

The molar absorption coefficient of the compound can be measured using a well-known method. For example, the molar absorption coefficient of the compound can be measured using an ultraviolet-visible spectrophotometer (Cary-5 spectrophotometer, manufactured by Varian Medical Systems, Inc.) and an ethyl acetate solvent at a concentration of 0.01 g/L.

Hereinafter, specific examples of the oxime compound which are preferably used in the present invention are shown below, but the present invention is not limited thereto.

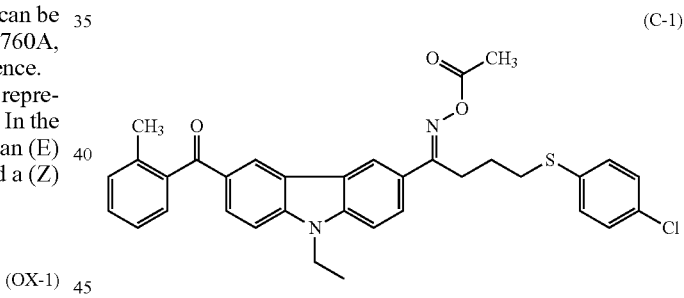
(C-1)

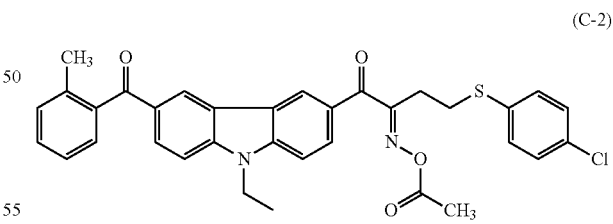
(C-2)

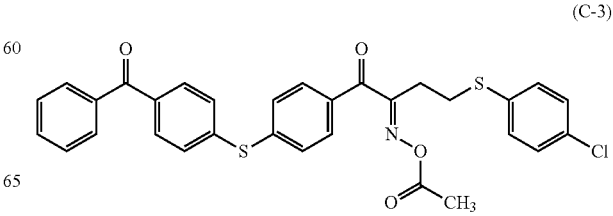
(C-3)

-continued

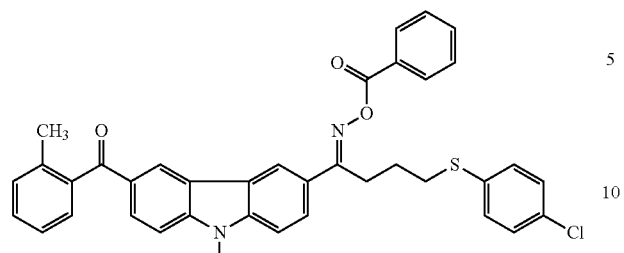

(C-4)

(C-5)

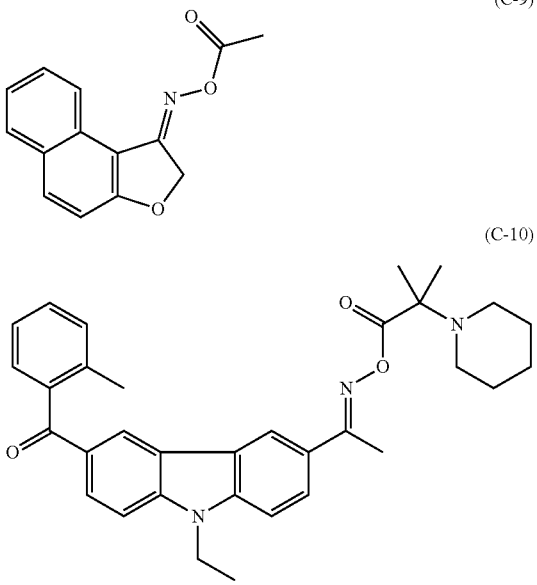

(C-9)

(C-10)

(C-11)

(C-12)

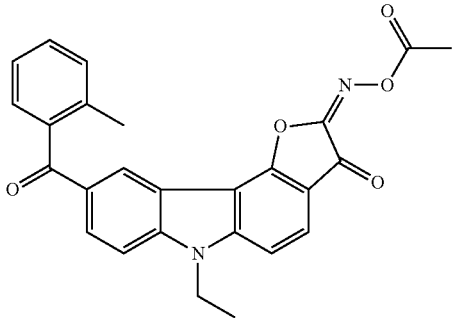

(C-6)

(C-7)

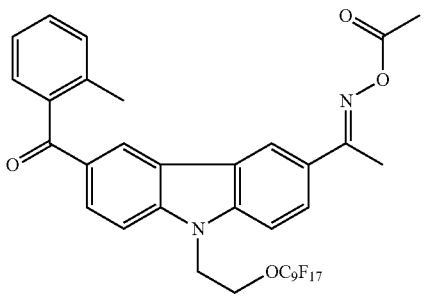

(C-8)

In the present invention, an oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

The content of the photopolymerization initiator is preferably 0.1 to 50 mass %, more preferably 0.5 to 30 mass %, and still more preferably 1 to 20 mass % with respect to the total solid content of the curable composition In the above-described range, excellent sensitivity and pattern formability can be obtained. The curable composition may include one photopolymerization initiator or two or more photopolymerization initiators. In a case where the curable composition includes two or more photopolymerization initiators, it is preferable that the total content of the two or more photopolymerization initiators is in the above-described range.

<<Resin>>

The curable composition according to the present invention may include a resin. The resin is mixed, for example, in order to disperse the pigments in the composition and to be used as a binder. The resin which is mainly used to disperse the pigments and the like will also be called a dispersant. However, the above-described uses of the resin are merely exemplary, and the resin can be used for purposes other than the uses.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher.

The content of the resin is preferably 10 to 80 mass % and more preferably 20 to 60 mass % with respect to the total solid content of the curable composition. The curable composition may include one resin or two or more resins. In a case where the curable composition includes two or more resins, it is preferable that the total content of the two or more resins is in the above-described range.

(Dispersant)

The curable composition according to the present invention may include a dispersant as a resin.

Examples of the dispersant include: a polymer dispersant such as a resin having an amine group (polyamideamine or a salt thereof), an oligo imine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate;

In terms of a structure, the polymer dispersant can be further classified into a linear polymer, a terminal-modified polymer, a graft polymer, and a block polymer.

In addition, as the polymer dispersant, a resin having an acid value of 60 mgKOH/g or higher (more preferably 60 mgKOH/g or higher and 300 mgKOH/g or lower) can be preferably used.

Examples of the terminal-modified polymer include a polymer having a phosphate group at a terminal thereof described in JP1991-112992A (JP-H3-112992A) or JP2003-533455A, a polymer having a sulfonate group at a terminal thereof described in JP2002-273191A, and a polymer having a partial skeleton or a heterocycle of an organic colorant described in JP1997-77994A (JP-H9-77994A). In addition, polymers described in JP2007-277514A in which two or more anchor sites (for example, an acid group, a basic group, a partial skeleton or a heterocycle of an organic colorant) to a pigment surface are introduced into a terminal thereof are also preferable due to its dispersion stability.

Examples of the graft polymer include a reaction product of poly(low-alkylene imine) and polyester described in JP1979-37082A (JP-S54-37082A), JP1996-507960A (JP-H8-507960A), or JP2009-258668A, a reaction product of polyallylamine and polyester described in JP1997-169821A (JP-H9-169821A), a copolymer of a macromonomer and a nitrogen-containing monomer described in JP1998-339949A (JP-H10-339949A) or JP2004-37986A, a graft polymer having a partial skeleton or a heterocycle of an organic colorant described in JP2003-238837A, JP2008-9426A, or JP2008-81732A, and a copolymer of a macromonomer and an acid group-containing monomer described in JP2010-106268A.

As the macromonomer used for manufacturing the graft polymer by radical polymerization, a well-known macromonomer can be used, and examples thereof include macromonomers manufactured by Toagosei Co., Ltd. such as AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group), and AB-6 (polybutyl acrylate having a methacryloyl group as a terminal group); macromonomers manufactured by Daicel Corporation such as PLACCEL FM5 (an adduct of 2-hydroxyethyl methacrylate and 5 molar equivalents of ε-caprolactone) and FA10L (an adduct of 2-hydroxyethyl acrylate and 10 molar equivalents of ε-caprolactone); and a polyester macromonomer described in JP1990-272009A (JP-H2-272009A). Among these, from the viewpoint of the dispersibility and dispersion stability of the pigment dispersion and the developability of the curable composition in which the pigment dispersion is used, a polyester macromonomer having excellent flexibility and solvent compatibility is more preferable, and the polyester macromonomer represented by the polyester macromonomer described in JP1990-272009A (JP-112-272009A) is most preferable.

As the block polymer, a block polymer described in JP2003-49110A or JP2009-52010A is preferable.

As the resin, a graft copolymer including a structural unit represented by any one of the following Formulae (1) to (4) can also be used.

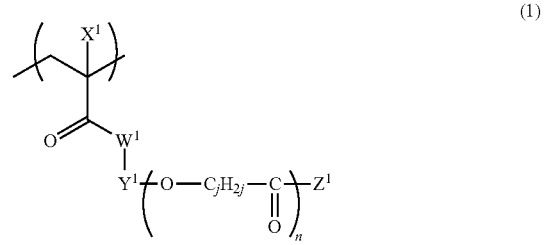

(1)

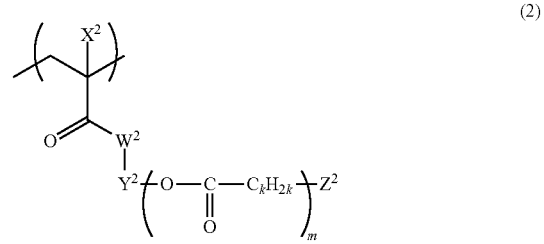

(2)

-continued

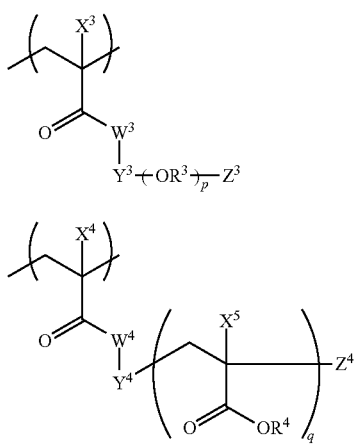

$X^1$, $X^2$, $X^3$, $X^4$, and $X^5$ each independently represent a hydrogen atom or a monovalent organic group, preferably a hydrogen atom or an alkyl group having 1 to 12 carbon atoms, more preferably a hydrogen atom or a methyl group, and still more preferably a methyl group.

$W^1$, $W^2$, $W^3$, and $W^4$ each independently represent an oxygen atom or NH and preferably an oxygen atom.

$R^3$ represents a branched or linear alkylene group (having preferably 1 to 10 carbon atoms and more preferably 2 or 3 carbon atoms). From the viewpoint of dispersion stability, it is preferable that $R^3$ represents a group represented by —$CH_2$—CH($CH_3$)— or a group represented by —CH($CH_3$)—$CH_2$—.

$Y^1$, $Y^2$, $Y^3$, and $Y^4$ each independently represent a divalent linking group, and a structure thereof is not particularly limited.

The graft copolymer can be found in the description of paragraphs "0025" to "0069 of JP2012-255128A, the content of which is incorporated herein by reference.

Specific examples of the graft copolymer are as follows. In addition, a resin described in paragraphs "0072" to "0094" of JP2012-255128A can be used.

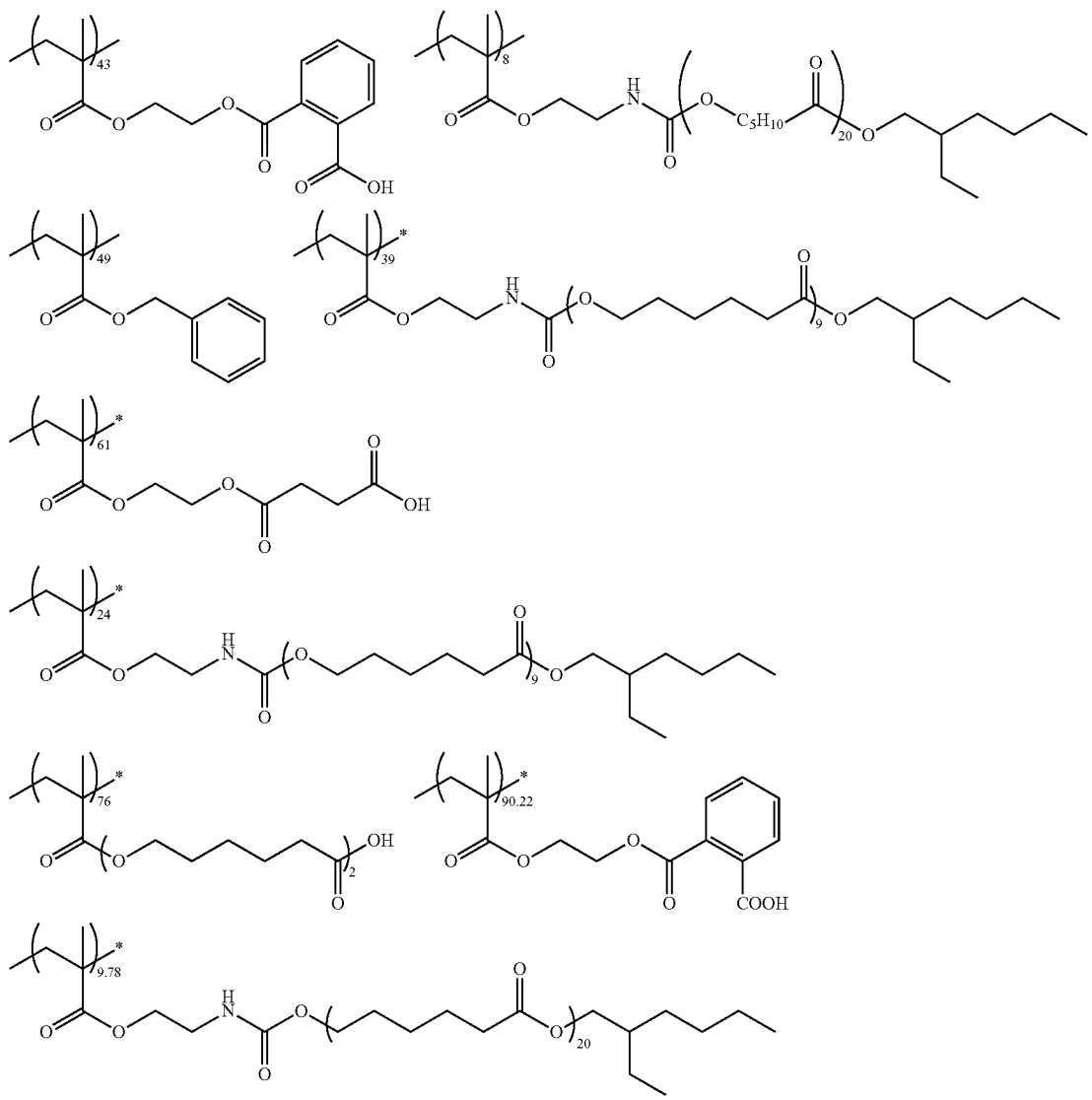

In addition, as the resin, an oligoimine dispersant having a nitrogen atom at at least either a main chain or a side chain can be used. As the oligoimine dispersant, a resin, which includes a structural unit having a partial structure X with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity.

Examples of the oligoimine dispersant include a dispersant including a structural unit represented by the following Formula (I-1), a structural unit represented by the following Formula (I-2), and/or a structural unit represented by the following Formula (I-2a).

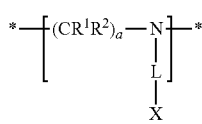
(I-1)

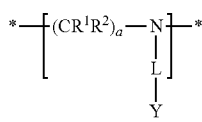
(I-2)

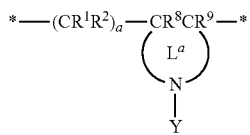
(I-2a)

$R^1$ and $R^2$ each independently represent a hydrogen atom, a halogen atom, or an alkyl group (having preferably 1 to 6 carbon atoms). a's each independently represent an integer of 1 to 5. * represents a linking portion between structural units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). R7 represents a hydrogen atom or an alkyl group having 1 to 6 carbon atoms.

$L^a$ is structural unit which forms a ring structure with $CR^8CR^9$ and N, preferably a structural unit which forms a nonaromatic heterocycle having 3 to 7 carbon atoms with $CR^8CR^9$ and a carbon atom, more preferably a structural unit which forms a nonaromatic 5- to 7-membered heterocycle with $CR^8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a functional group (pKa: 14 or lower).

Y represents a side chain having 40 to 10000 atoms.

The dispersant (oligoimine dispersant) may further include one or more copolymerization components selected from the group consisting of the structural units represented by Formulae (I-3), (I-4), and (I-5). By the dispersant including the above-described structural units, the dispersion performance can be further improved.

(I-3)

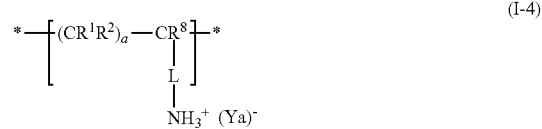
(I-4)

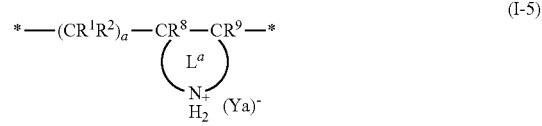
(I-5)

$R^1$, $R^2$, $R^8$, $R^9$, L, La, a, and * have the same definitions as those in Formulae (I-1), (I-2), and (I-2a).

Ya represents a side chain having 40 to 10000 atoms which has an anionic group. The structural unit represented by Formula (I-3) can be formed by adding an oligomer or a polymer having a group, which reacts with amine to form a salt, to a resin having a primary or secondary amino group at a main chain such that they react with each other.

The oligoimine dispersant can be found in the description of paragraphs "0102" to "0166" of JP2012-255128A, the content of which is incorporated herein by reference.

Specific examples of the oligoimine dispersant are as follows. In addition, a resin described in paragraphs "0168" to "0174" of JP2012-255128A can be used.

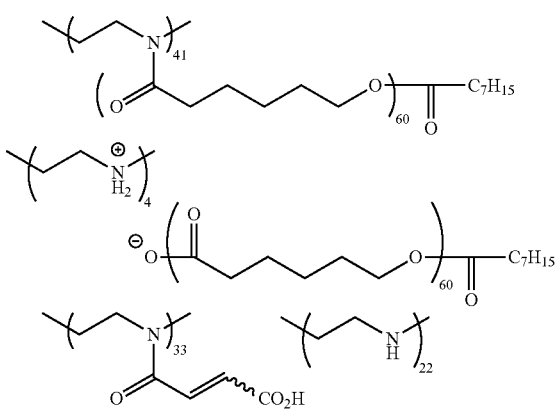

As the resin, a resin including a structural unit represented by the following Formula (P1) can be used. By using the following resin, the dispersibility of the infrared absorber (in particular, the pyrrolopyrrole colorant compound represented by Formula (1)) can be further improved.

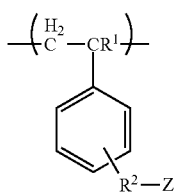

(P1)

In Formula (P1), R¹ represents a hydrogen atom or a methyl group, R² represents an alkylene group, and Z represents a nitrogen-containing heterocyclic structure.

The alkylene group represented by R² is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a structure including a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, a phenoxazine ring, an acridone ring, an anthraquinone ring, a benzimidazole structure, a benzotriazole structure, a benzothiazole structure, a cyclic amide structure, a cyclic urea structure, or a cyclic imide structure. Among these, as the nitrogen-containing heterocyclic structure represented by Z, a structure represented by the following Formula (P2) or (P3) is preferable.

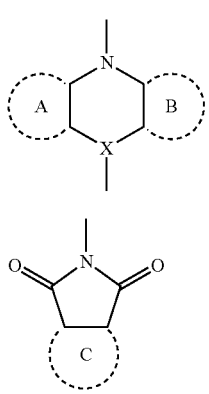

(P2)

(P3)

In Formula (P2), X represents one selected from the group consisting of a single bond, an alkylene group (for example, a methylene group, an ethylene group, a propylene group, a trimethylene group, or a tetramethylene group), —O—, —S—, —NR—, and —C(=O)—. Here, R represents a hydrogen atom or an alkyl group. Examples of the alkyl group represented by R include a methyl group, an ethyl group, a n-propyl group, an i-propyl group, a n-butyl group, a t-butyl group, a n-hexyl group, a n-octyl group, a 2-ethylhexyl group, and a n-octadecyl group.

Among these, X represents preferably a single bond, a methylene group, —O—, or —C(=O)— and more preferably —C(=O)—.

In Formulae (P2) and (P3), ring A, ring B, and ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, a phenoxazine ring, an acridone ring, or an anthraquinone ring is preferable, and a benzene ring, a naphthalene ring, or a pyridine ring is more preferable.

Specific examples of the structural unit represented by Formula (P1) are as follows. In addition, specific examples of the structural unit can be found in paragraph "0023" of JP2008-009426A, the content of which is incorporated herein by reference.

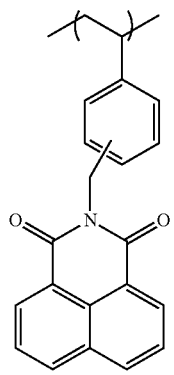

The resin including the structural unit represented by Formula (P1) may further include the structural unit represented by any one of Formulae (1) to (4) of the resin. In addition, the resin including the structural unit represented by Formula (P1) may further the structural unit represented by any one of Formulae (I-1), (I-2), (I-2a), (I-3), (I-4), and (I-5) of the resin.

Specific examples of the resin including the structural unit represented by Formula (P1) are as follows.

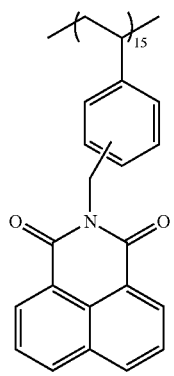

-continued

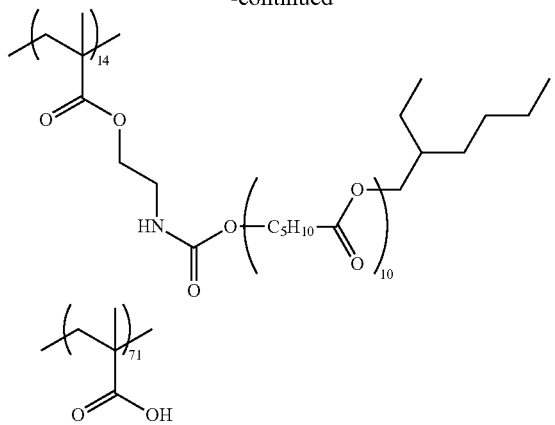

The resin is available as a commercially available product, and specific examples thereof include: "Disperbyk-101 (polyamideamine phosphate), 107 (carboxylate), 110, 111 (copolymer containing an acid group), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4010 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "W001: cationic surfactant" manufactured by Yusho Co., Ltd.; nonionic surfactants such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters; anionic surfactants such as "W004, W005, and W017" all of which are manufactured by Yusho Co., Ltd.; polymer dispersants such as "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and a polymer dispersant such as "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

Among these resins, one kind may be used alone, or two or more kinds may be used in combination. In the present invention, in particular, it is preferable that the pigment derivative described below and a polymer dispersant are used in combination. In addition, regarding the resin, the terminal-modified polymer, the graft polymer, or the block polymer having an anchor site to a pigment surface may be used in combination with an alkali-soluble resin described below. Examples of the alkali-soluble resin include a (meth) acrylic acid copolymer, an itaconic acid copolymer, a crotonic acid copolymer, a maleic acid copolymer, a partially esterified maleic acid copolymer, an acidic cellulose derivative having a carboxylic acid at a side chain thereof, and a resin obtained by modifying a polymer having a hydroxyl group with an acid anhydride. Among these, a (meth)acrylic acid copolymer is preferable. In addition, an N-position-substituted maleimide monomer copolymer described in JP1998-300922A (JP-H10-300922A), an ether dimer copolymer described in JP2004-300204A, or an alkali-soluble resin having a polymerizable group described in JP1995-319161A (JP-H7-319161A) is also preferable.

The content of the dispersant is preferably 1 to 80 parts by mass, more preferably 5 to 70 parts by mass, and still more preferably 10 to 60 parts by mass with respect to 100 parts by mass of the pigment.

(Alkali-Soluble Resin)

It is preferable that the curable composition according to the present invention includes an alkali-soluble resin as a resin. By the composition including the alkali-soluble resin, developability and pattern formability is improved. The alkali-soluble resin can also be used as the dispersant or the binder.

The molecular weight of the alkali-soluble resin is not particularly limited, and the weight-average molecular weight (Mw) thereof is preferably 5000 to 100000. In addition, the number-average molecular weight (Mn) of the alkali-soluble resin is preferably 1000 to 20000.

The alkali-soluble resin may be a linear organic polymer and can be appropriately selected from alkali-soluble resins having at least one group for promoting alkali solubility in a molecule (preferably a molecule having an acrylic copolymer or a styrene copolymer as a main chain).

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxyl group, a phosphate group, a sulfonate group, and a phenolic hydroxyl group. A group that is soluble in an organic solvent and is developable with a weakly alkaline aqueous solution is preferable, and (meth)acrylic acid is more preferable. Among these acid groups, one kind may be used alone, or two or more kinds may be used in combination.

During the preparation of the alkali-soluble resin, for example, a well-known radical polymerization method can be used. Polymerization conditions under which the alkali-soluble resin is prepared using a radical polymerization method, for example, the temperature, the pressure, the kind and amount of a radical initiator, and the kind of a solvent can be easily set by those skilled in the art and can also be experimentally set.

As the alkali-soluble resin, a polymer having a carboxylic acid at a side chain thereof is preferable, and examples thereof include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxyl group at a side chain thereof; and a resin obtained by adding an acid anhydride to a polymer having a hydroxyl group. In particular, a copolymer of (meth)acrylic acid and another monomer which is copolymerizable with the (meth) acrylic acid is preferable as the alkali-soluble resin. Examples of the monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth) acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer copolymer described in JP1998-300922A (JP-H10-300922A) include N-phenylmaleimide and N-cyclohexylmaleimide. Among these monomers which are copolymerizable with the (meth)acrylic acid, one kind may be used alone, or two or more kinds may be used in combination.

In addition, in order to improve a crosslinking effect of the film, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group at a side chain thereof is preferable.

Examples of the alkali-soluble resin having a polymerizable group include DIANAL NR series (manufactured by Mitsubishi Rayon Co., Ltd.), Photomer 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), Ebecryl 3800 (manufactured by Daicel-UCB Co., Ltd.), and ACRYCURE RD-F8 (manufactured by Nippon Shokubai Co., Ltd.).

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth) acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

In addition, as a commercially available product, for example, FF-426 (manufactured by Fujikura Kasei Co., Ltd.) can also be used.

As the alkali-soluble resin, a polymer (a) obtained by copolymerization of monomer components including a compound represented by the following Formula (ED1) and/or a compound represented by Formula (1) described in JP2010-168539A (hereinafter, these compounds will also be referred to as "ether dimer") is also preferable.

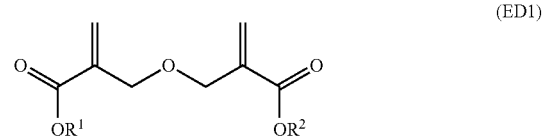

(ED1)

In Formula (ED1), $R^1$ and $R^2$ each independently represent a hydrogen atom or a hydrocarbon group having 1 to 25 carbon atoms which may have a substituent.

The hydrocarbon group having 1 to 25 carbon atoms represented by $R^1$ and $R^2$ in Formula (ED1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Examples of the ether dimer can be found in paragraph "0317" of JP2013-29760A, the content of which is incorporated herein by reference. Among these ether dimers, one kind may be used alone, or two or more kinds may be used in combination. A structure derived from the compound represented by Formula (ED1) may be copolymerized with other monomers.

The alkali-soluble resin may include a structural unit which is derived from a compound represented by the following Formula (X).

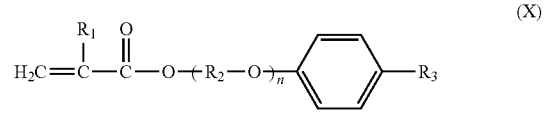

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

Specific examples of the alkali-soluble resin are as follows.

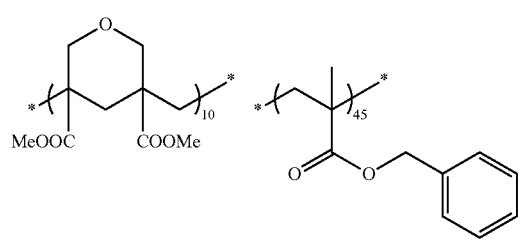

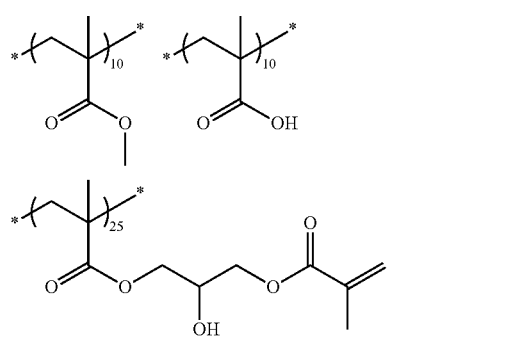

Mw = 12000

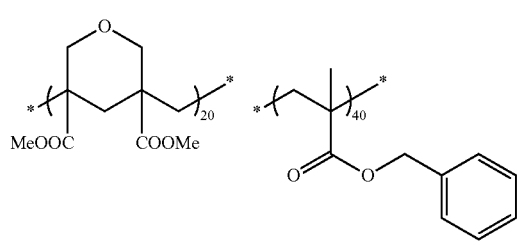

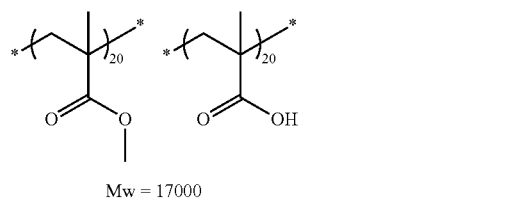

Mw = 17000

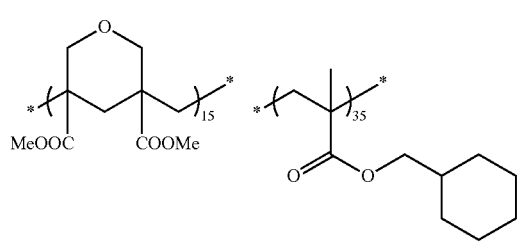

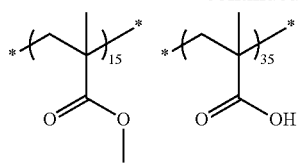

Mw = 18000

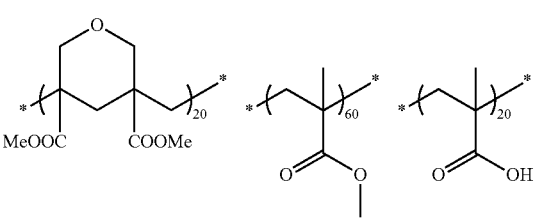

Mw = 18000

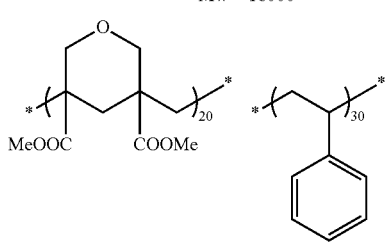

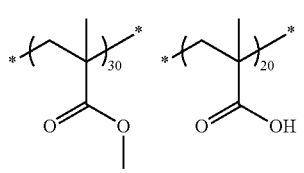

Mw = 18000

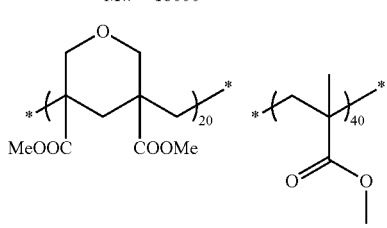

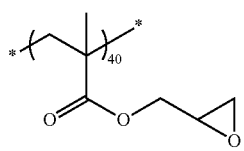

Mw = 19000

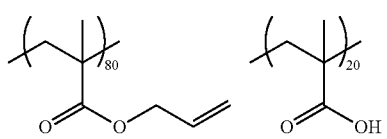

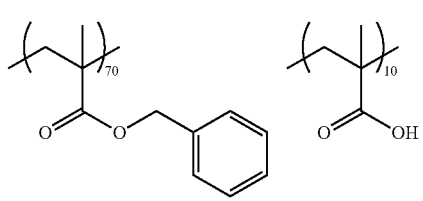

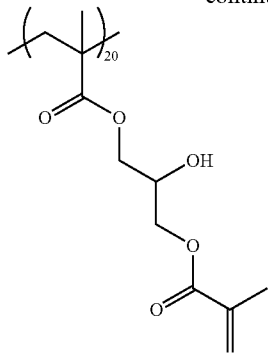

The details of the alkali-soluble resin can be found in paragraphs "0558" to "0571" of JP2012-208494A (corresponding to paragraphs "0685" to "0700" of US2012/0235099A), the content of which is incorporated herein by reference.

Further, a copolymer (B) described in paragraphs "0029" to "0063" and an alkali-soluble resin used in Examples of JP2012-32767A, a binder resin described in paragraphs "0088" to "0098" and a binder resin used in Examples of JP2012-208474A, a binder resin described in paragraphs "0022" to "0032 and a binder resin used in Examples of JP2012-137531A, a binder resin described in paragraphs "0132" to "0143" and a binder resin used in Examples of JP2013-024934A, a binder resin described in paragraphs "0092" to "0098" and Examples of JP2011-242752A, or a binder resin described in paragraphs "0030" to "0072" of JP2012-032770A can also be used. The content of which is incorporated herein by reference.

The acid value of the alkali-soluble resin is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and even yet still more preferably 120 mgKOH/g or lower.

The content of the alkali-soluble resin is preferably 0.1 to 20 mass % with respect to the total solid content of the curable composition. The lower limit is preferably 0.5 mass %% or higher, more preferably 1 mass % or higher, still more preferably 2 mass % or higher, and even still more preferably 3 mass % or higher. The upper limit is more preferably 12 mass % or lower, and still more preferably 10 mass % or lower. The curable composition according to the present invention may include one alkali-soluble resin or two or more alkali-soluble resins. In a case where the curable composition includes two or more alkali-soluble resins, it is preferable that the total content of the two or more alkali-soluble resins is in the above-described range.

<<Solvent>>

The curable composition according to the present invention may include a solvent. Examples of the solvent include an organic solvent. Basically, the solvent is not particularly limited as long as it satisfies the solubility of each component and the coating properties of the composition. However, it is preferable that the organic solvent is selected in consideration of the coating properties and safety of the composition.

Preferable examples of the organic solvent are as follows:

an ester, for example, ethyl acetate, n-butyl acetate, isobutyl acetate, cyclohexyl acetate, amyl formate, isoamyl acetate, isobutyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, or butyl oxyacetate (for example, methyl methoxyacetate, ethyl methoxyacetate, butyl methoxyacetate, methyl ethoxyacetate, or ethyl ethoxyacetate)), a 3-oxypropionic acid alkyl ester (for example, 3-methyl oxypropionate or 3-ethyl oxypropionate (for example, methyl 3-methoxypropionate, ethyl 3-methoxypropionate, methyl 3-ethoxypropionate, or ethyl 3-ethoxypropionate)), a 2-oxypropionic acid alkyl ester (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methylpropionate or ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene.

Among these organic solvents, one kind may be used alone, or two or more kinds may be used in combination.

In a case where two or more organic solvents are used in combination, in particular, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, as the organic solvent, an organic solvent containing 0.8 mmol/L or lower of a peroxide is preferable, and an organic solvent containing no peroxide is more preferable.

The content of the solvent is preferably 10 to 90 mass %, more preferably 20 to 80 mass %, and still more preferably 25 to 75 mass % with respect to the total mass of the curable composition.

<<Polymerization Inhibitor>>

The curable composition according to the present invention may include a polymerization inhibitor in order to prevent unnecessary thermal polymerization of the polymerizable compound during the manufacturing or storage of the curable composition.

Examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine cerium (III) salt. Among these, p-methoxyphenol is preferable. Among these, p-methoxyphenol is preferable.

The content of the polymerization inhibitor is preferably 0.01 to 5 mass % with respect to the total solid content of the curable composition.

<<Substrate Adhesive>>

The curable composition according to the present invention may include a substrate adhesive.

As the substrate adhesive, a silane coupling agent, a titanate coupling agent, or an aluminum coupling agent can be preferably used.

Examples of the silane coupling agent include γ-methacryloxypropyl trimethoxy silane, γ-methacryloxypropyl triethoxy silane, γ-acryloxypropyl trimethoxy silane, γ-acryloxypropyl triethoxy silane, γ-mercaptopropyl trimethoxy silane, γ-aminopropyl triethoxy silane, and phenyl trimethoxy silane. Among these, γ-methacryloxypropyl trimethoxy silane is preferable as the substrate adhesive. Examples of a commercially available product of the substrate adhesive include N-β-aminoethyl-γ-aminopropyl-methyldimethoxysilane (KBM-602, trade name, manufactured by Shin-Etsu Chemical Co., Ltd.), N-β-aminoethyl-γ-aminopropyl-trimethoxysilane (KBM-603, trade name, manufactured by Shin-Etsu Chemical Co., Ltd.), N-β-aminoethyl-γ-aminopropyl-triethoxysilane (KBE-602, trade name, manufactured by Shin-Etsu Chemical Co., Ltd.), γ-aminopropyl-trimethoxysilane (KBM-903, trade name, manufactured by Shin-Etsu Chemical Co., Ltd.), γ-aminopropyl-triethoxysilane (KBE-903, trade name, manufactured by Shin-Etsu Chemical Co, Ltd.), 3-methacryloxypropyltrimethoxysilane (KBM-503, trade name, manufactured by Shin-Etsu Chemical Co., Ltd.), and glycidoxyoctyltrimethoxysilane (KBM-4803, trade name, manufactured by Shin-Etsu Chemical Co., Ltd.).

In addition, as the silane coupling agent, a silane coupling agent Y having at least a silicon atom, a nitrogen atom, and a curable functional group in a molecule and having a hydrolyzable group bonded to a silicon atom can also be used.

The hydrolyzable group refers to a substituent directly linked to a silicon atom and capable of forming a siloxane bond due to a hydrolysis reaction and/or a condensation reaction. Examples of the hydrolyzable group include a halogen atom, an alkoxy group, an acyloxy group, and an alkenyloxy group. In a case where the hydrolyzable group has carbon atoms, the number of carbon atoms is preferably 6 or less and more preferably 4 or less. In particular, an alkoxy group having 4 or less carbon atoms or an alkenyloxy group having 4 or less carbon atoms is preferable.

The silane coupling agent Y is not particularly limited as long as it has at least one silicon atom in a molecule thereof, and the silicon atom can be bonded to the following atoms and substituents. These atoms and substituents may be the same as or different from each other. Examples of the atoms and substituents bonded to the silicon atom include a hydrogen atom, a halogen atom, a hydroxyl group, an alkyl group having 1 to 20 carbon atoms, an alkenyl group, an alkynyl group, an aryl group, an amino group which can be substituted with an alkyl group and/or an aryl group, a silyl group, an alkoxy group having 1 to 20 carbon atoms, and an aryloxy group. These substituents may be further substituted with a silyl group, an alkenyl group, an alkynyl group, an aryl group, an alkoxy group, an aryloxy group, a thioalkoxy group, an amino group which can be substituted with an alkyl group and/or an aryl group, a halogen atom, a sulfonamide group, an alkoxycarbonyl group, an amide group, a urea group, an ammonium group, an alkylammonium group, a carboxyl group or a salt thereof, or a sulfo group or a salt thereof.

At least one hydrolyzable group is bonded to the silicon atom. The definition of the hydrolyzable group is as described above.

The silane coupling agent Y may include a group represented by the following Formula (Z).

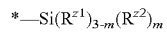  Formula (Z)

$R^{z1}$ represents an alkyl group, $R^{z2}$ represents a hydrolyzable group, and m represents an integer of 1 to 3. The number of carbon atoms in the alkyl group represented by $R^{z1}$ is preferably 1 to 5 and more preferably 1 to 3. The definition of the hydrolyzable group represented by $R^{z2}$ is as described above.

The silane coupling agent Y includes at least one nitrogen atom in a molecule thereof. It is preferable that the nitrogen atom is present in the form of a secondary amino group or a tertiary amino group, that is, it is preferable that the nitrogen atom has at least one organic group as a substituent. Regarding the structure of the amino group, the amino group may be present in a molecule in the form of a partial structure of a nitrogen-containing heterocycle, or may be present as a substituted amino group such as aniline. Here, examples of the organic group include an alkyl group, an alkenyl group, an alkynyl group, an aryl group, and a combination thereof. These organic groups may further have a substituent, and examples of the substituent which can be introduced include a silyl group, an alkenyl group, an alkynyl group, an aryl group, an alkoxy group, an aryloxy group, a thioalkoxy group, an amino group, a halogen atom, a sulfonamide group, an alkoxycarbonyl group, a carbonyloxy group, an amide group, a urea group, an alkyleneoxy group, an ammonium group, an alkylammonium group, a carboxyl group or a salt thereof, and a sulfo group.

In addition, it is preferable that the nitrogen atom is bonded to a curable functional group through an arbitrary organic linking group. Preferable examples of the organic linking group include the above-described substituents which can be introduced into the nitrogen atom and the organic group bonded to the nitrogen atom.

The curable functional group included in the silane coupling agent Y is preferably one or more groups selected from the group consisting of a (meth)acryloyloxy group, an epoxy group, an oxetanyl group, an isocyanate group, a hydroxyl group, an amino group, a carboxyl group, a thiol group, an alkoxysilyl group, a methylol group, a vinyl group, a (meth)acrylamide group, a styryl group, and a maleimide group, more preferably one or more groups selected from the group consisting of a (meth)acryloyloxy group, an epoxy group, and an oxetanyl group, and still more preferably one or more groups selected from the group consisting of a (meth)acryloyloxy group, an epoxy group, and an oxetanyl group.

The silane coupling agent Y is not particularly limited as long as it has at least one curable functional group in a molecule thereof. However, the silane coupling agent Y may have two or more curable functional groups. From the viewpoints of sensitivity and stability, the number of curable functional groups in a molecule is preferably 2 to 20, more preferably 4 to 15, and most preferably 6 to 10.

Examples of the silane coupling agent Y include a compound represented by the following Formula (Y).

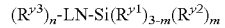  Formula (Y)

$R^{y1}$ represents an alkyl group, $R^{y2}$ represents a hydrolyzable group, and $R^{y3}$ represents a curable functional group. LN represents a (n+1) valent linking group having a nitrogen atom.

m represents an integer of 1 to 3, and n represents an integer of 1 or more.

$R^{y1}$, $R^{y2}$, $R^{y3}$, and m in Formula (Y) have the same definitions and the same preferable ranges as those of $R^{z1}$, $R^{z2}$, $R^{z3}$, and m in Formula (W).

In in Formula (Y) represents an integer of 1 or more. The upper limit is, for example, preferably 20 or less, more preferably 15 or less, and still more preferably 10 or less. The lower limit is, for example, preferably 2 or more, more preferably 4 or more, and still more preferably 6 or more. In addition, n may represent 1.

LN in Formula (Y) represents a group having a nitrogen atom.

Examples of the group having a nitrogen atom include at least one group selected from groups represented by the following Formula (LN-1) to (LN-4), and a group of a combination of at least one group selected from groups represented by the following Formula (LN-1) to (LN-4), —CO—, —CO$_2$—, —O—, —S—, and —SO$_2$—. The alkylene group may be linear or branched. The alkylene group and the arylene group may have a substituent or may be unsubstituted. Examples of the substituent include a halogen atom and a hydroxyl group.

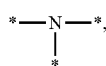
(LN-1)

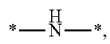
(LN-2)

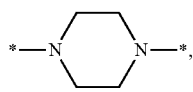
(LN-3)

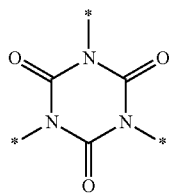
(LN-4)

In the formula, * represents a direct bond.

Specific examples of the silane coupling agent Y include the following compounds. In the formula, Et represents an ethyl group. Other examples of the silane coupling agent Y include a compound described in paragraphs "0018" to "0036" of JP2009-288703A, the content of which is incorporated herein by reference.

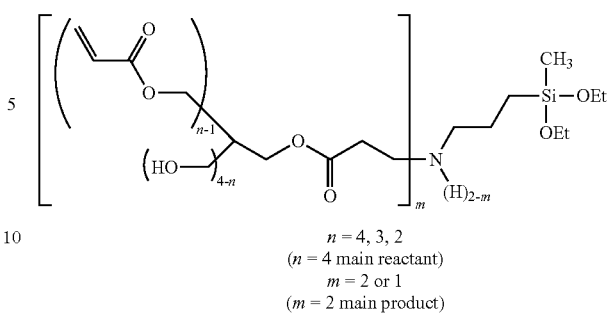

n = 4, 3, 2
(n = 4 main reactant)
m = 2 or 1
(m = 2 main product)

The content of the substrate adhesive is preferably 0.1 to 30 mass %, more preferably 0.5 to 20 mass %, and still more preferably 1 to 10 mass % with respect to the total solid content of the curable composition.

<<Surfactant>>

The curable composition according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the composition including a fluorine surfactant, liquid characteristics (for example, fluidity) of a coating solution prepared from the composition are further improved, and the uniformity in coating thickness and liquid saving properties can be further improved.

That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Examples of the fluorine surfactant include: MEGAFACE F171, F172, F173, F176, F177, F141, F142, F143, F144, R30, F437, F475, F479, F482, F554, F780, and RS-72-K (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC1068, SC-381, SC-383, 5393, and KH-40 (all of which are manufactured by Asahi Glass Co., Ltd.); and PF636, PF656, PF6320, PF6520, and PF7002 (all of which are manufactured by OMNOVA Solutions Inc.). As the fluorine surfactant, a block polymer can also be used, and specific examples thereof include a compound described in JP2011-89090A.

As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

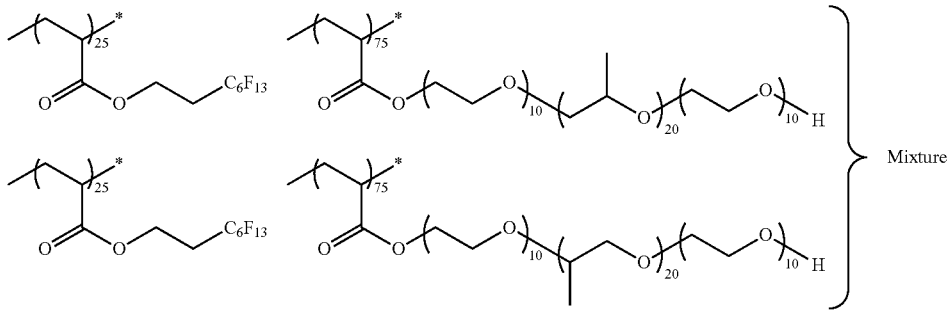

The weight-average molecular weight of the compound is, for example, 14000.

Specific examples of the nonionic surfactant include glycerol, trimethylolpropane, trimethylolethane, an ethoxylate and a propoxylate thereof (for example, glycerol propoxylate or glycerin propoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 and TETRONIC 304, 701, 704, 901, 904, and 150R1 (all of which are manufactured by BASF SE); and SOLSPERSE 20000 (manufactured by Lubrication Technology Inc.). In addition, NCW-101, NCW-1001, or NCW-1002 (manufactured by Wako Pure Chemical Industries, Ltd.) can also be used.

Specific examples of the cationic surfactant include a phthalocyanine derivative (trade name: EFKA-745, manufactured by Morishita Co., Ltd.), an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Specific examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the curable composition.

<<Ultraviolet Absorber>>

The curable composition according to the present invention may include an ultraviolet absorber.

As the ultraviolet absorber, a well-known compound can be used. As the ultraviolet absorber, a conjugated diene compound having an amino group is preferable, and examples thereof include a compound described in paragraphs "0038" to "0052" of JP2009-217221A. For example, the following compound can be used.

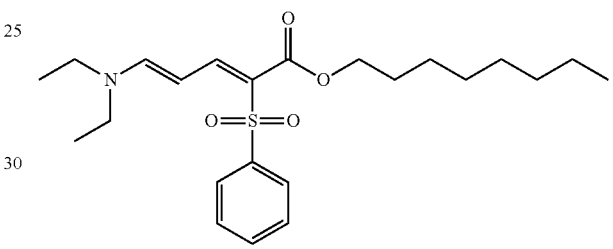

Examples of a commercially available product of the ultraviolet absorber include UV503 (manufactured by Daito Chemical Co., Ltd.).

The content of the ultraviolet absorber is preferably 0.01 to 10 mass % and more preferably 0.01 to 5 mass % with respect to the mass of the total solid content of the composition.

<<Other Components>>

The curable composition according to the present invention optionally includes: a chain transfer agent such as N,N-dialkylamino benzoic acid alkyl ester or 2-mercaptobenzothiazole; a thermal polymerization initiator such as an azo compound or a peroxide compound; a thermal polymerization component; a plasticizer such as dioctyl phthalate; a developability improving agent such as a low molecular weight organic carboxylic acid; and other various additives such as an antioxidant, or an aggregation inhibitor.

In addition, in order to increase the degree of cure of a film during heating after development, a thermal curing agent can be added. Examples of the thermal curing agent include a thermal polymerization initiator such as an azo compound or a peroxide, a novolac resin, a resol resin, an epoxy compound, and a styrene compound.

Depending on materials used and the like, the composition may include a metal element. From the viewpoint of, for example, suppressing the generation of defects, the content of a Group 2 element (for example, calcium or magnesium) in the composition is controlled to be preferably 50 ppm or lower and more preferably 0.01 to 10 ppm. In addition, the total amount of inorganic metal salts in the composition is controlled to be preferably 100 ppm or lower and more preferably 0.5 to 50 ppm.

<Method of Manufacturing Pigment Dispersion and Method of Manufacturing Curable Composition>

It is preferable that a method of manufacturing a pigment dispersion used in the present invention includes a step of dispersing the pigment in the presence of a solvent. For the dispersion, optionally, for example, a resin (dispersant), a pigment derivative, and the like may be further added. For the dispersion, a disperser such as a beads mill may be used.

In addition, in a case where the curable composition according to the present invention includes the α-type oxytitanium phthalocyanine pigment and a pigment other than the α-type oxytitanium phthalocyanine pigment, a method of manufacturing the curable composition according to the present invention includes a step of dispersing (co-dispersing) the α-type oxytitanium phthalocyanine pigment and the pigment other than the α-type oxytitanium phthalocyanine pigment in the presence of a solvent. In addition, the curable composition according to the present invention can be manufactured by performing the dispersing on the respective pigments and mixing pigment dispersions in which the respective pigments are dispersed. Examples of the pigment other than the α-type oxytitanium phthalocyanine pigment include a chromatic pigment and an organic black pigment. In addition, the α-type oxytitanium phthalocyanine pigment may be milled.

In the present invention, it is preferable that the curable composition is manufactured by co-dispersing the α-type oxytitanium phthalocyanine pigment and the pigment other than the α-type oxytitanium phthalocyanine pigment. According to this aspect, in a case where the dispersion stability is insufficient with only the α-type oxytitanium phthalocyanine pigment, a chromatic colorant or an organic black colorant, which is additionally added to adjust spectral characteristics, is added during the dispersion of the α-type oxytitanium phthalocyanine pigment, and the components are co-dispersed. As a result, an effect of improving the dispersion stability of the α-type oxytitanium phthalocyanine pigment can be obtained. It is generally known that a chromatic colorant or an organic black colorant has excellent dispersion stability. It is presumed that the dispersion stability of the α-type oxytitanium phthalocyanine pigment is improved by co-dispersing a chromatic colorant or an organic black colorant with the α-type oxytitanium phthalocyanine pigment.

By adding the respective components such as the curable compound to the pigment dispersions, the curable composition according to the present invention can be obtained The other components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, two or more solutions or dispersions may be appropriately prepared using the respective components, and the solutions or dispersions may be mixed with each other during use (during application) to prepare the composition.

During the manufacturing of the curable composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 μm and is preferably about 0.01 to 3.0 μm and more preferably about 0.05 to 0.5 μm. In the above-described range, fine foreign matter, which inhibits a fine and smooth composition in the next step, can be reliably removed. In addition, a fibrous filter material is also preferably used, and examples of the filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPR005), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the filtering using the second filtering may be performed on a mixture of the dispersion and other components.

<Film>

Next, a film according to the present invention will be described.

The film according to the present invention is formed by curing the above-described curable composition according to the present invention. The film according to the present invention can be used as an infrared cut filter or an infrared transmitting filter. The film according to the present invention may be a film having a pattern or a film (flat film) not having a pattern.

The α-type oxytitanium phthalocyanine pigment has excellent transmittance in a visible range and excellent light shielding properties to light in a wavelength range of 800 to 900 nm (in particular, about 850 nm). Therefore, by using the film according to the present invention as an infrared cut filter, a filter that has excellent transmittance in a visible range and shields light in a wavelength range of 800 nm or longer (preferably 800 to 900 nm) can be obtained.

In addition, the α-type oxytitanium phthalocyanine pigment has excellent transmittance to light in a wavelength range of longer than 900 nm. Therefore, by using the α-type oxytitanium phthalocyanine pigment in combination with the coloring material that shields visible light (preferably a coloring material including two or more chromatic colorants), the film according to the present invention can be preferably used as an infrared transmitting filter. Examples of the infrared transmitting filter include a filter that shields visible light and allows transmission of light in a wavelength range of 900 nm or longer. In a case where the film according to the present invention is used as an infrared transmitting filter, it is preferable that infrared transmitting filter is a filter that is formed using a composition including the α-type oxytitanium phthalocyanine pigment and the coloring material that shields visible light (preferably a coloring material including two or more chromatic colorants or a coloring material including at least an organic black colorant), or is a filter in which a layer of the coloring material that shields visible light is separately present in addition to a layer including the α-type oxytitanium phthalocyanine pigment. In a case where the film according to the present invention is used as an infrared transmitting filter, the α-type oxytitanium phthalocyanine pigment has a function of limiting an infrared range of light to be transmitted (infrared light) to a long wavelength side.

In a case where the film according to the present invention is used as an infrared transmitting filter, it is preferable that the film according to the present invention has the following spectral characteristics (1) and/or (2). According to this aspect, a film capable of allowing transmission of infrared light (preferably light having a wavelength of 900 nm or longer) in a state where noise generated from visible light is small can be formed.

(1): It is preferable that a maximum value of a light transmittance of the film in a thickness direction in a wavelength range of 400 to 830 nm is 20% or lower and that a minimum value of a light transmittance of the film in the thickness direction in a wavelength range of 1000 to 1300 nm is 70% or higher. The maximum value of the light transmittance in the thickness direction of the film in a wavelength range of 400 to 830 nm is preferably 20% or lower and more preferably 10% or lower. The minimum value of the light transmittance in the thickness direction of the film in a wavelength range of 1000 to 1300 nm is preferably 70% or higher and more preferably 80% or higher.

(2): It is preferable that a maximum value of a light transmittance of the film in a thickness direction in a wavelength range of 450 to 650 nm is 20% or lower, that a light transmittance of the film in the thickness direction at a wavelength of 835 nm is 20% or lower, and that a minimum value of a light transmittance of the film in the thickness direction in a wavelength range of 1000 to 1300 nm is 70% or higher. The maximum value of the light transmittance of the film in the thickness direction in a wavelength range of 450 to 650 nm is preferably 20% or lower and more preferably 10% or lower. The maximum value of the light transmittance of the film in the thickness direction in a wavelength range of 650 to 835 nm is preferably 50% or lower and more preferably 30% or lower. The light transmittance of the film in the thickness direction at a wavelength of 835 nm is preferably 20% or lower and more preferably 10% or lower. The minimum value of the light transmittance of the film in the thickness direction in a wavelength range of 1000 to 1300 nm is preferably 70% or higher and more preferably 80% or higher.

The spectral characteristics of the film according to the present invention are values obtained by measuring the transmittance in a wavelength range of 300 to 1300 nm using a spectrophotometer of an ultraviolet-visible-near infrared spectrophotometer (U-4100, manufactured by Hitachi High-Technologies Corporation).

In a case where the film according to the present invention is used as an infrared cut filter, the film according to the present invention may or may not include a chromatic colorant. By the film according to the present invention further including a chromatic colorant in addition to the α-type oxytitanium phthalocyanine pigment, a filter having both an infrared cut filter and a color filter can also be obtained.

In a case where the film according to the present invention is used as an infrared cut filter or an infrared transmitting filter, an infrared cut filter and an infrared transmitting filter can be used in combination. By using an infrared cut filter and an infrared transmitting filter in combination with an infrared transmitting filter, this combination can be preferably used for an infrared sensor that detects infrared light at a specific wavelength. In a case where both an infrared cut filter and an infrared transmitting filter are used in combination, among the infrared cut filter and the infrared transmitting filter, one may be a film (the film according to the present invention) which is formed using the curable composition according to the present invention, and the other one may be a film which is formed using a composition other than the curable composition according to the present invention.

In addition, in a case where the film according to the present invention is used as an infrared cut filter, the infrared cut filter may be or may not be adjacent to a color filter in the thickness direction. In a case where the infrared cut filter is not adjacent to the color filter in the thickness direction, the infrared cut filter may be formed on another substrate other than a substrate on which the color filter is formed, or another member (for example, a microlens or a planarizing layer) constituting a solid image pickup element may be interposed between the infrared cut filter and the color filter.

The thickness of the film according to the present invention can be adjusted according to the purpose. The thickness is preferably 20 µm or less, more preferably 10 µm or less, and still more preferably 5 µm or less. For example, the lower limit of the thickness is preferably 0.1 µm or more, more preferably 0.2 µm or more, and still more preferably 0.3 µm or more.

The film according to the present invention can be used in various devices such as a solid image pickup element such as CCD or CMOS, an infrared sensor, or an image display device.

<Pattern Forming Method>

A pattern forming method according to the present invention includes: forming a curable composition layer on a support using the curable composition according to the present invention; and forming a pattern on the curable composition layer using a photolithography method or a dry etching method.

In a case where a laminate an infrared cut filter and a color filter are laminated is manufactured, pattern formation on the infrared cut filter and pattern formation on the color filter may be separately performed. In addition, pattern formation may be performed on the laminate in which the infrared cut filter and the color filter are laminated (that is, pattern formation on the infrared cut filter and pattern formation on the color filter may be simultaneously performed).

The case where pattern formation on the infrared cut filter and pattern formation on the color filter are separately performed denotes the following aspect. Pattern formation is performed on any one of the infrared cut filter and the color filter. Next, the other filter layer is formed on the filter layer on which the pattern is formed. Next, pattern formation is performed on the filter layer on which a pattern is not formed.

A pattern forming method may be a pattern forming method using photolithography or a pattern forming method using dry etching.

In a case where the pattern forming method using photolithography is adopted, a dry etching step is not necessary, and an effect that the number of steps can be reduced can be obtained.

In a case where the pattern forming method using dry etching is adopted, a photolithography function is not necessary. Therefore, an effect that the concentration of the infrared absorber in the curable composition can increase can be obtained.

In a case where the pattern formation on the infrared cut filter and the pattern formation on the color filter are separately performed, the pattern formations on the respective filter layers may be performed using only the photolithography method or only the dry etching method. In addition, after performing the pattern formation on one filter layer using the photolithography method, the pattern formation may be performed on the other filter layer using the dry etching method. In a case where the pattern formation is performed using a combination of the dry etching method and the photolithography method, it is preferable that a pattern is formed on a first layer using the dry etching method and a pattern is formed on a second or subsequent layer using the photolithography method.

It is preferable that the pattern formation using the photolithography method includes: a step of forming a curable composition layer on a support using each curable composition; a step of exposing the curable composition layer in a pattern shape; and a step of forming a pattern by removing a non-exposed portion by development. Optionally, the pattern formation further includes: a step (pre-baking step) of baking the curable composition layer; and a step (post-baking step) of baking the developed pattern.

In addition, It is preferable that the pattern formation using the dry etching method includes: a step of forming a curable composition layer on a support using each composition and curing the cured composition layer; a step of forming a photoresist layer on the cured composition layer; a step of obtaining a resist pattern by patterning the photoresist layer by exposure and development; and a step of forming a pattern by dry-etching the cured composition layer by using the resist pattern as an etching mask. Hereinafter, the respective steps will be described.

<<Step of Forming Curable Composition Layer>>

In the step of forming a curable composition layer, a curable composition layer is formed on a support using each of the curable compositions.

As the support, for example, a substrate for a solid image pickup element obtained by providing a solid image pickup element (light-receiving element) such as CCD or CMOS on a substrate (for example, a silicon substrate) can be used.

The pattern according to the present invention may be formed on a solid image pickup element-formed surface (front surface) of the substrate for a solid image pickup element, or may be formed on a solid image pickup element non-formed surface (back surface) thereof.

Optionally, an undercoat layer may be provided on the support to improve adhesion with a layer above the support, to prevent diffusion of materials, or to make a surface of the substrate flat.

As a method of applying the curable composition to the support, various methods such as slit coating, an ink jet method, spin coating, cast coating, roll coating, or screen printing can be used.

The curable composition layer formed on the support may be dried (pre-baked). In a case where a pattern is formed through a low-temperature process, pre-baking is not necessarily performed.

In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. By setting the pre-baking temperature to be 150° C. or lower, the characteristics can be effectively maintained, for example, even in a case where a photoelectric conversion film of an image sensor is formed of an organic material.

The pre-baking time is preferably 10 to 300 seconds, more preferably 40 to 250 seconds, and still more preferably 80 to 220 seconds. Drying can be performed using a hot plate, an oven, or the like.

In a case where the pattern formation is simultaneously performed on a plurality of layers, it is preferable that a curable composition for forming each of the layers is applied to the curable composition layer to form another curable composition layer.

(Case where Pattern is Formed Using Photolithography Method)

<<Exposure Step>>

Next, the curable composition layer is exposed in a pattern shape (exposure step). For example, the curable composition layer is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). For example, the irradiation dose (exposure dose) is preferably 30 to 5000 $mJ/cm^2$. The upper limit is preferably 3000 $mJ/cm^2$ or lower, more preferably 2000 $mJ/cm^2$ or lower, and still more preferably 1500 $mJ/cm^2$ or lower. The lower limit is preferably 50 $mJ/cm^2$ or higher and more preferably 80 $mJ/cm^2$ or higher.

<<Development Step>>

Next, a pattern is formed by removing a non-exposed portion by development. The non-exposed portion can be removed by development using a developer. As a result, a non-exposed portion of the curable composition layer in the exposure step is eluted into the developer, and only the photocured portion remains.

As the developer, an organic alkali developer which does not cause damages to a solid image pickup element as a substrate, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of an alkaline agent used in the developer include an organic alkaline compound such as ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, or 1,8-diazabicyclo-[5,4,0]-7-undecene. As the developer, an alkaline aqueous solution is preferably used in which the above alkaline agent is diluted with pure water such that a concentration thereof is 0.001 to 10 mass % and preferably 0.01 to 1 mass %.

In addition, an inorganic alkali may be used as the developer. Preferable examples of the inorganic alkali include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the curable composition. Among these, a nonionic surfactant is preferable.

In a case where a developer including the alkaline aqueous solution is used, in general, it is preferable that the film is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher.

The film after the development is post-baked continuously or batchwise using heating means such as a hot plate, a convection oven (hot air circulation dryer), a high-frequency heater under the above-described conditions. In addition, in a case where a pattern is formed through a low-temperature process, post-baking is not necessarily performed.

(Case where Pattern is Formed Using Dry Etching Method)

The pattern formation using the dry etching method can be performed by curing the curable composition layer formed on the support to form a cured composition layer, and then etching the cured composition layer with etching gas by using a patterned photoresist layer as a mask.

Specifically, it is preferable that a positive type or negative type radiation sensitive composition is applied to the cured composition layer and is dried such that a photoresist layer is formed. It is preferable that pre-baking is further performed in order to form the photoresist layer. In particular, in a preferable embodiment, as a process of forming the photoresist, baking after exposure or baking after development (post-baking) is performed.

As the photoresist layer, a positive type radiation sensitive composition, which is reactive with radiation including ultraviolet rays (g-rays, h-rays, i-rays), far ultraviolet rays such as excimer laser, electron beams, ion beams, and X-rays, is preferably used. Among the radiations, g-rays, h-rays, or i-rays are preferable, and i-rays are more preferable.

Specifically, as the positive type radiation sensitive composition, a composition including a quinonediazide compound and an alkali-soluble resin is preferable. The positive type radiation sensitive composition including a quinonediazide compound and an alkali-soluble resin uses a configuration in which a quinonediazide group is decomposed into a carboxyl group by irradiation of light having a wavelength of 500 nm or shorter such that the state of the composition is converted from alkali-insoluble to alkali-soluble. The positive type photoresist has significantly high resolution and thus is used to prepare an integrated circuit such as an integrated circuit (IC) or a large scale integration (LSI). Examples of the quinonediazide compound include a naphthoquinonediazide compound. Examples of a commercially available product of the quinonediazide compound include FHi622BC" (manufactured by Fujifilm Electronic Materials Co., Ltd.).

The thickness of the photoresist layer is preferably 0.1 to 3 µm, more, preferably 0.2 to 2.5 µm, and still more preferably 0.3 to 2 µm. As a method of applying the positive type radiation sensitive composition, the above-described methods of applying the curable composition is preferable.

Next, by exposing and developing the photoresist layer, a resist pattern (patterned photoresist layer) including a group of resist through-holes is formed. The formation of the resist pattern is not particularly limited and can be appropriately optimized and performed using a well-known photolithography technique of the related art. By providing the group of resist through-holes in the photoresist layer by exposure and development, a resist pattern used as an etching mask in the next etching is provided on the cured composition layer.

The exposure of the photoresist layer can be performed by exposing the positive type or negative type radiation sensitive composition with g-rays, h-rays, i-rays, or the like (preferably i-rays) through a predetermined mask pattern. By performing development using a developer after exposure, a photoresist is removed from a region where a color pattern is desired to be formed.

As the developer, any developer can be used as long as it has no effect on a cured composition layer including a colorant and an exposed portion of a positive resist and a non-cured portion of a negative resist are soluble therein. For example, a combination of various solvents or an alkaline aqueous solution can be used. It is preferable that the alkaline aqueous solution is prepared by dissolving an alkaline compound such that the concentration thereof is 0.001 to 10 mass % and preferably 0.01 to 5 mass %. Examples of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, and 1,8-diazabicyclo[5.4.0]-7-undecene. In a case where an alkaline aqueous solution is used, in general, a rinsing treatment using water is performed after development.

Next, patterning is performed by dry-etching the colored layer using the resist pattern as an etching mask so as to form a group of through-holes in the cured composition layer.

From the viewpoint of forming a pattern cross-section in a substantially rectangular shape or the viewpoint of further reducing damages to the support, it is preferable that dry etching is performed according the following embodiment.

In the preferable embodiment, first etching, second etching, and over etching is performed. In the first etching, etching is performed using a mixed gas of fluorine gas and oxygen gas ($O_2$) up to a region (depth) where the support is not exposed. In the second etching, after the first etching, etching is performed using a mixed gas of nitrogen gas ($N_2$) and oxygen gas ($O_2$) preferably up to a region (depth) where the support is exposed. In the over etching, etching is performed after the support is exposed. Hereinafter, a specific method of dry etching, the first etching, the second etching, and the over etching will be described.

The dry etching is performed after obtaining etching conditions in advance using the following method.

(1) An etching rate (nm/min) in the first etching, and an etching rate (nm/min) in the second etching are calculated, respectively.

(2) A time required to perform etching up to a desired thickness in the first etching, and a time required to perform etching up to a desired thickness in the second etching are calculated, respectively.

(3) The first etching is performed for the etching time calculated in (2).

(4) The second etching is performed for the etching time calculated in (2). Alternatively, an etching time may be determined based on a detected end point, and the second etching may be performed for the determined etching time.

(5) An over etching time is calculated in consideration of the total etching time of (3) and (4), and the over etching is performed for the calculated over etching time.

From the viewpoint of processing an organic material, which is a film to be etched, in a rectangular shape, it is preferable that a mixed gas used in the first etching step includes fluorine gas and oxygen gas ($O_2$). In addition, by performing etching up to a region where the support is not exposed in the first etching step, damages to the support can be avoided. In addition, after etching is performed using a mixed gas of fluorine gas and oxygen gas up to a region where the support is not exposed in the first etching step, in second etching step and the over etching step, it is preferable that etching is performed using a mixed gas of nitrogen gas and oxygen gas from the viewpoint of avoiding damages to the support.

It is important to determine a ratio between the etching amount in the first etching step and the etching amount in the second etching step such that the rectangularity obtained by etching in the first etching step does not deteriorate. A latter ratio in the total etching amount (the sum of the etching amount in the first etching step and the etching amount in the second etching step) is preferably higher than 0% and 50% or lower and more preferably 10% to 20%. The etching amount refers to a value which is calculated from a difference between the thickness of a film to be etched before etching and the thickness of the film remaining after etching.

In addition, it is preferable that the etching includes over etching. It is preferable that the over etching is performed after setting an over etching ratio. In addition, it is preferable that the over etching ratio is calculated based on a first etching time. The over etching ratio can be arbitrarily set and is preferably 30% or lower, more preferably 5 to 25%, and still more preferably 10 to 15% with respect to the total etching time of the etching process from the viewpoints of obtaining etching resistance of a photoresist and maintaining rectangularity of an etched pattern.

Next, the resist pattern (that is, the etching mask) remaining after etching is removed. It is preferable that the removal of the resist pattern includes: a step of applying a peeling solution or a solvent to the resist pattern such that the resist pattern can be peeled; and a step of removing the resist pattern using rinse water.

Examples of the step applying a peeling solution or a solvent to the resist pattern such that the resist pattern can be peeled include a step of applying a peeling solution or a solvent to at least the resist pattern and holding the peeling solution and the solvent for a predetermined time to perform puddle development. The time for which the peeling solution or the solvent is held is not particularly limited and is preferably several tens of seconds to several minutes.

In addition, examples of the step of removing the resist pattern using rinse water include a step of spraying rinse water to the resist pattern through a spray type or shower type spray nozzle to remove the resist pattern. As the rinse water, pure water is preferably used. In addition, examples of the spray nozzle include: a spray nozzle in which a spraying range includes the entire region of the support; and a movable spray nozzle in which a movable range includes the entire region of the support. In a case where the spray nozzle is movable, the nozzle moves twice or more in a region from the center of the support to end portions of the support to spray rinse water during the step of removing the resist pattern. As a result, the resist pattern can be more effectively removed.

In general, the peeling solution may further include an organic solvent or an inorganic solvent. Examples of the organic solvent include 1) a hydrocarbon compound, 2) a halogenated hydrocarbon compound, 3) an alcohol compound, 4) an ether or acetal compound, 5) a ketone or aldehyde compound, 6) an ester compound, 7) a polyhydric alcohol compound, 8), a carboxylic acid or acid anhydride compound, 9) a phenol compound, 10) a nitrogen-containing compound, 11) a sulfur-containing compound, and 12) a fluorine-containing compound. It is preferable that the peeling solution includes a nitrogen-containing compound, and it is more preferable that the peeling solution includes an acyclic nitrogen-containing compound and a cyclic nitrogen-containing compound.

It is preferable that the acyclic nitrogen-containing compound is an acyclic nitrogen-containing compound having a hydroxyl group. Specific examples of the acyclic nitrogen-containing compound having a hydroxyl group include monoisopropanolamine, diisopropanolamine, triisopropanolamine, N-ethylethanolamine, N,N-dibutylethanolamine, N-butylethanolamine, monoethanolamine, diethanolamine, and triethanolamine. Among these, monoethanolamine, diethanolamine, or triethanolamine is preferable, and monoethanolamine ($H_2NCH_2CH_2OH$) is more preferable. In addition, examples of the cyclic nitrogen-containing compound include isoquinoline, imidazole, N-ethylmorpholine, ε-caprolactam, quinoline, 1,3-dimethyl-2-imidazolidinone, α-picoline, β-picoline, γ-picoline, 2-picoline, 3-picoline, 4-picoline, piperazine, piperidine, pyrazine, pyridine, pyrrolidine, N-methyl-2-pyrrolidone, N-phenylmorpholine, 2,4-lutidine, and 2,6-lutidine. Among these, N-methyl-2-pyrrolidone or N-ethylmorpholine is preferable, and N-methyl-2-pyrrolidone (NMP) is more preferable.

It is preferable that the peeling solution includes an acyclic nitrogen-containing compound and a cyclic nitrogen-containing compound. It is more preferable that the peeling solution includes, as an acyclic nitrogen-containing compound, at least one selected from the group consisting of monoethanolamine, diethanolamine, and triethanolamine and includes, as a cyclic nitrogen-containing compound, at least one cyclic nitrogen-containing compound selected from N-methyl-2-pyrrolidone and N-ethylmorpholine. It is still more preferable that the peeling solution includes monoethanolamine and N-methyl-2-pyrrolidone.

When the peeling solution is removed, the resist pattern formed on the pattern only has to be removed. Even in a case where a deposit as an etching product is attached to a side wall of the pattern, it is not necessary to completely remove the deposit. The deposit refers to an etching product which is attached and deposited to a side wall of the cured composition layer.

In the peeling solution, the content of the acyclic nitrogen-containing compound is preferably 9 parts by mass to 11 parts by mass with respect to 100 parts by mass of the peeling solution, and the content of the cyclic nitrogen-containing compound is preferably 65 parts by mass to 70 parts by mass with respect to 100 parts by mass of the peeling solution. In addition, it is preferable that the peeling solution is obtained by diluting a mixture of the acyclic nitrogen-containing compound and the cyclic nitrogen-containing compound with pure water.

<Solid Image Pickup Element>

A solid image pickup element according to the present invention includes the film according to the present invention. The solid image pickup element according to the present invention is configured to include the film according to the present invention. The configuration of the solid image pickup element is not particularly limited as long as the solid image pickup element functions. For example, the following configuration can be adopted.

The solid image pickup element includes plural photodiodes and transfer electrodes on the support, the photodiodes constituting a light receiving area of the solid image pickup element (for example, a charge coupled device (CCD) image sensor or a complementary metal-oxide semiconductor (CMOS) image sensor), and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the present invention such as an infrared cut filter or an infrared transmitting filter is formed on the device protective film.

Further, a configuration in which light collecting means (for example, a microlens; hereinafter, the same shall be applied) is provided above the device protective film and below the film according to the present invention (on a side thereof close the support), or a configuration in which light collecting means is provided on the film according to the present invention may be adopted.

<Infrared Sensor>

An infrared sensor according to the present invention includes the film according to the present invention. The configuration of the infrared sensor according to the present invention is not particularly limited as long as it includes the film according to the present invention and functions as an infrared sensor.

Hereinafter, an embodiment of the infrared sensor according to the present invention will be described using the drawings.

In FIG. 1, reference numeral 110 represents a solid image pickup element. In an imaging region provided on a solid image pickup element 110, infrared cut filters 111 and infrared transmitting filters 114 are provided. In addition, color filters 112 are laminated on the infrared cut filters 111. Microlenses 115 are disposed on an incidence ray hv side of the color filters 112 and the infrared transmitting filters 114. A planarizing layer 116 is formed so as to cover the microlenses 115.

Characteristics of the infrared cut filters 111 can be selected depending on the emission wavelength of an infrared light emitting diode (infrared LED) described below.

In a case where the emission wavelength of the infrared LED is 850 nm, it is preferable that the infrared cut filter 111 is a filter that allows transmission of visible light (for example, light in a wavelength range of 400 to 700 nm) and shields light in a wavelength range of longer than 850 nm. For example, a film which is formed using the curable composition according to the present invention is preferable.

In addition, in a case where the emission wavelength of the infrared LED is 940 nm, it is preferable that the infrared cut filter 111 is a filter that allows transmission of visible light (for example, light in a wavelength range of 400 to 700 nm) and shields light in a wavelength range of longer than 940 nm.

The color filters 112 is not particularly limited as long as pixels which allow transmission of light having a specific wavelength in the visible range and absorbs the light are formed therein, and well-known color filters of the related art for forming an image can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED described below.

For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm. The maximum value of the light transmittance in a wavelength range of 400 to 650 nm is typically 0.1% or higher.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 900 to 1300 nm is typically 99.9% or lower.

The thickness of the infrared transmitting filter 114 is preferably 100 μm or less, more preferably 15 μm or less, still more preferably 5 μm or less, and even still more preferably 1 μm or less. The lower limit value is preferably 0.1 μm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using a spectrophotometer of an ultraviolet-visible-near infrared spectrophotometer (U-4100, manufactured by Hitachi High-Technologies Corporation).

The infrared transmitting filter 114 having the above-described spectral characteristics can be formed using a curable composition including the coloring material that shields visible light. The details of the coloring material that shields visible light are the same as the range described above regarding the curable composition according to the present invention.

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

The infrared transmitting filter 114 having the above-described spectral characteristics can be manufactured using a curable composition including the coloring material that shields visible light and an infrared absorber having a maximal absorption in a wavelength range of 750 to 950 nm. The details of the coloring material that shields visible light are the same as the range described above regarding the curable composition according to the present invention. Examples of the infrared absorber include the α-type oxytitanium phthalocyanine pigment and the other infrared absorber descried above regarding the curable composition according to the present invention.

The patterns of the infrared cut filters, the color filters, and the infrared transmitting filters used in the infrared sensor shown in FIG. 1 can be formed, for example, as follows.

Figure 2:
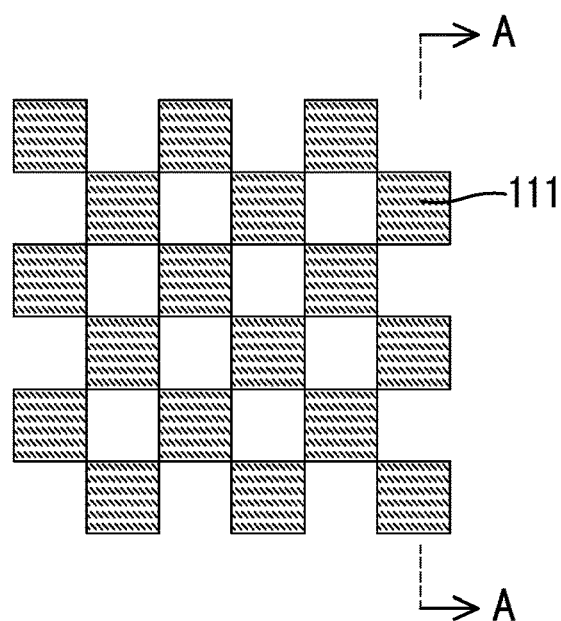
FIG. 2 is a diagram (plan view) showing a step of forming a pattern.
Figure 3:
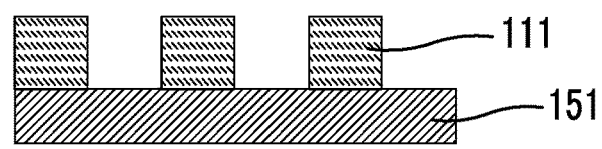
FIG. 3 is a cross-sectional view taken along line A-A of FIG. 2.

First, a curable composition for forming the infrared cut filter (infrared absorbing composition) is applied to the support 151 to form an infrared absorbing composition layer. Next, a pattern is formed on the infrared absorbing composition layer as shown in FIGS. 2 and 3. The pattern forming method may be any one of the photolithography method and the dry etching method. In FIGS. 2 and 3, a Bayer (lattice) pattern is formed on the infrared absorbing composition layer. However, a shape of the pattern can be appropriately selected according to the use.

Figure 4:
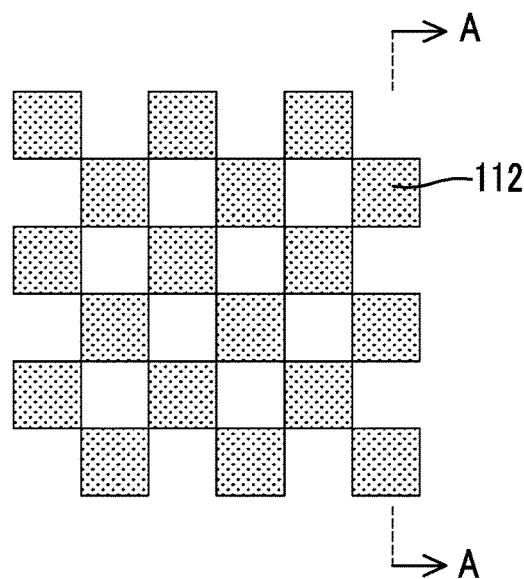
FIG. 4 is a diagram (plan view) showing a step of forming a pattern.
Figure 5:
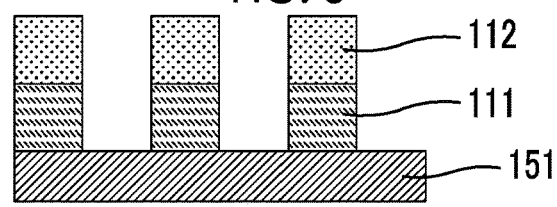
FIG. 5 is a cross-sectional view taken along line A-A of FIG. 4.

Next, a curable composition (coloring composition) for forming the color filter is applied to the Bayer pattern (the infrared cut filters 111) of the infrared absorbing composition layer to form a coloring composition layer thereon. Next, as shown in FIGS. 4 and 5, the coloring composition layer is patterned to form a Bayer pattern (the color filters 112) of the coloring composition layer on the Bayer pattern (the infrared cut filters 111) of the infrared absorbing composition layer. The pattern forming method may be any one of the photolithography method and the dry etching method and is preferably the photolithography method.

Figure 6:
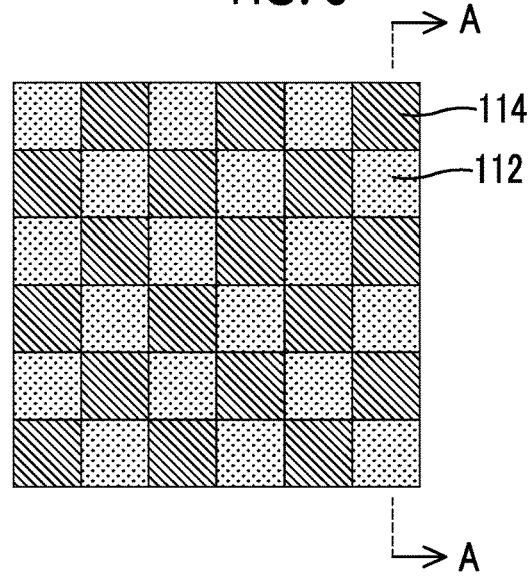
FIG. 6 is a diagram (plan view) showing a step of forming a pattern.
Figure 7:
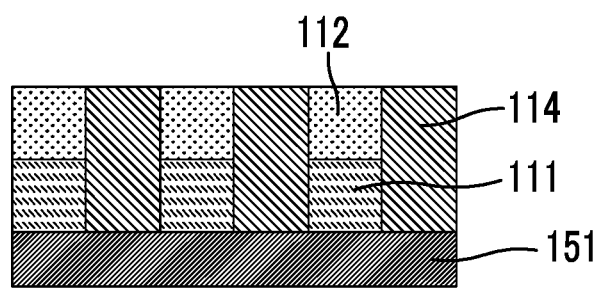
FIG. 7 is a cross-sectional view taken along line A-A of FIG. 6.

Next, a curable composition for forming the infrared transmitting filter is applied to the films on which the color filters 112 are formed to form a curable composition layer thereon. Next, as shown in FIGS. 6 and 7, the curable composition layer is patterned to form a pattern of the infrared transmitting filters 114 on a portion where the Bayer pattern of the infrared cut Filters 111 is not formed.

In addition, in the embodiment shown in FIG. 1, the color filters 112 are provided on the incidence ray hv side compared to the infrared cut filter 111. The lamination order of the infrared cut filter 111 and the color filters 112 may be reversed, and the infrared cut filter 111 may be provided on the incidence ray hv side compared to the color filters 112.

In addition, in the embodiment shown in FIG. 1, the infrared transmitting filter 114 may be configured as a single-layer film or as a multi-layer film including two or more layers.

In addition, in the embodiment shown in FIG. 1, the infrared cut filters 111 and the color filters 112 are laminated adjacent to each other. However, the infrared absorbing filters 111 and the color filters 112 are not necessarily provided adjacent to each other. The infrared cut filters 111 may be formed on another support other than the support on which the color filters 112 are formed. As the support, any transparent substrate can be preferably used. In addition, a transparent substrate including copper, a substrate which includes a transparent layer including copper, or a substrate on which a band pass filter is formed can also be used.

Figure 8:
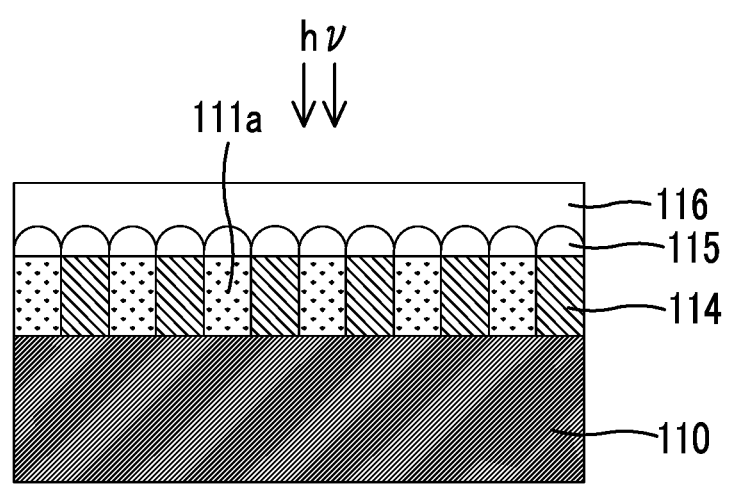
FIG. 8 is a schematic diagram showing another embodiment of an infrared sensor.

In addition, in a case where the infrared cut filter 111 further has a function as a color filter by further including a chromatic colorant in addition to the α-type oxytitanium phthalocyanine pigment, the color filters 112 are not necessarily provided as shown in FIG. 8. In FIG. 8, reference numeral 111a represents an infrared cut filter including a chromatic colorant which also has a function as a color filter.

<Image Display Device>

The film (preferably the infrared cut filter) according to the present invention can also be used in an image display device such as a liquid crystal display device or an organic electroluminescence (organic EL) display device. For example, by using the infrared cut filter in combination with the respective colored pixels (for example, red, green, blue), the infrared cut filter can be used for the purpose of shielding infrared light included in light emitted from a backlight (for example, a white light emitting diode (white LED)) of a display device to prevent a malfunction of a peripheral device, or for the purpose of forming an infrared pixel in addition to the respective color display pixels.

The definition of a display device and the details of each display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices descried in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development—Know-How Collection of High Brightness, High Precision, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "part(s)" and "%" represent "part(s) by mass" and "mass %".

[Synthesis of α-Type Oxytitanium Phthalocyanine Pigment]

An α-type oxytitanium phthalocyanine pigment was synthesized using a method described in paragraph "0035" of JP1999-21466A (JP-H11-21466A).

[Analysis of Crystal Structure of Oxytitanium Phthalocyanine Pigment]

θ-2θ X-ray diffraction of the oxytitanium phthalocyanine pigment at 25° C. was performed using an X-ray diffractometer (RINT-2500, manufactured by Rigaku Corporation).

The α-type oxytitanium phthalocyanine pigment showed clear peaks at Bragg angles (2θ±0.2°) of 7.6° and 28.6°.

A β-type oxytitanium phthalocyanine pigment showed clear peaks at Bragg angles (2θ±0.2°) of 9.3° and 26.3°.

A Y-type oxytitanium phthalocyanine pigment showed a clear peak at Bragg angles (2θ±0.2°) of 27.3°.

[Measurement of Content of Each of Crystal Structures in Oxytitanium Phthalocyanine Pigment]

The content of each of the crystal structures in the oxytitanium phthalocyanine pigment was measured with a calibration curve method using an X-ray diffractometer RINT-2500 (manufactured by Rigaku Corporation).

[Preparation of Oxytitanium Phthalocyanine (TiOPc) Pigment Dispersion 1]

12.9 parts by mass of an oxytitanium phthalocyanine (TiOPC) pigment, 5.1 parts by mass of a resin 3, and 82.0 parts by mass of propylene glycol methyl ether acetate (PGMEA) were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm until the average particle size of the pigment was 100 nm or less. As a result, a TiOPc pigment dispersion 1 was prepared. The volume average particle size of a pigment in the pigment dispersion was measured using MICROTRAC UPA 150 (manufactured by Nikkiso Co., Ltd.).

[Preparation of TiOPc Pigment Dispersion 2]

12.9 parts by mass of the TiOPc pigment, 5.1 parts by mass of a resin 5, and 82.0 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm until the average particle size of the pigment was 100 nm or less. As a result, a TiOPe pigment dispersion 2 was prepared. The volume average particle size of a pigment in the pigment dispersion was measured using MICROTRAC UPA 150 (manufactured by Nikkiso Co., Ltd.).

[Preparation of TiOPc Pigment Dispersion 3]

7.7 parts by mass of the TiOPc pigment, 5.2 parts by mass of a black colorant (Irgaphor Black, manufactured by BASF SE), 5.1 parts by mass of the resin 3, and 82.0 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm until the average particle size of the pigment was 100 nm or less. As a result, a TiOPe pigment dispersion 3 was prepared. The volume average particle size of a pigment in the pigment dispersion was measured using MICROTRAC UPA 150 (manufactured by Nikkiso Co., Ltd.).

[Preparation of TiOPc Pigment Dispersion 4 (Co-Dispersion)]

9.6 parts by mass of the TiOPc pigment, 3.3 parts by mass of C.I. Pigment Blue 15:6, 5.1 parts by mass of the resin 3, and 82.0 parts by mass of PGMEA were mixed and dispersed using a beads mill (a high-pressure dispersing machine with a pressure reducing mechanism, NANO-3000-10 (manufactured by Nippon BEE Chemical Co., Ltd.)) with zirconia beads having a diameter of 0.3 mm until the average particle size of the pigment was 100 nm or less. As a result, a TiOPc pigment dispersion 4 was prepared. The volume average particle size of a pigment in the pigment dispersion was measured using MICROTRAC UPA 150 (manufactured by Nikkiso Co., Ltd.).

[Preparation of Pigment Dispersions 1-1 to 1-4]

A mixed solution having a composition shown below was mixed and dispersed for 3 hours using a beads mill (a high-pressure dispersing machine with a pressure reducing mechanism, NANO-3000-10 (manufactured by Nippon BEE Chemical Co., Ltd.)) with zirconia beads having a diameter of 0.3 mm. This way, pigment dispersions were prepared. The table below shows the amounts (unit: part(s) by mass) of the corresponding components.

TABLE 2

|  | Colorant | Resin | Organic Solvent |
|---|---|---|---|
| Pigment Dispersion 1-1 | PR254 (13.5) | Resin 2 (2.0)<br>Resin 6 (2.0) | PGMEA (82.5) |
| Pigment Dispersion 1-2 | PB15:6(13.5) | Resin 3 (4.0) | PGMEA (82.5) |
| Pigment Dispersion 1-3 | PY139(14.8) | Resin 1 (3.0)<br>Resin 6 (2.2) | PGMEA (80.0) |
| Pigment Dispersion 1-4 | Black Colorant 1 (14.8) | Resin 1 (5.2) | PGMEA (80.0) |

PR254: C.I. Pigment Red 254

PB15:6: C.I. Pigment Blue 15:6

PY139: C.I. Pigment Yellow 139

Black Colorant 1: Irgaphor Black (manufactured by BASF SE)

Resin 1: Disperbyk-111 (manufactured by BYK Chemie)

Resin 2: the following structure (Mw: 7950)

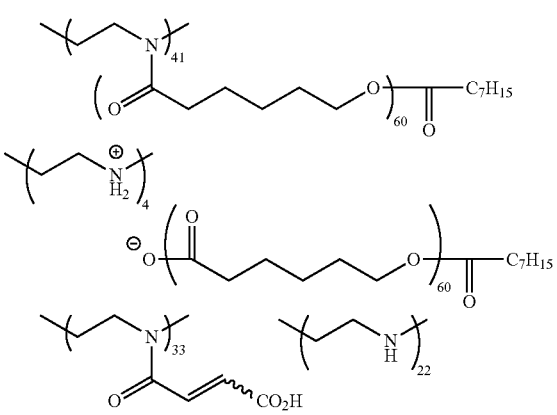

Resin 3: the following structure (Mw: 30000)

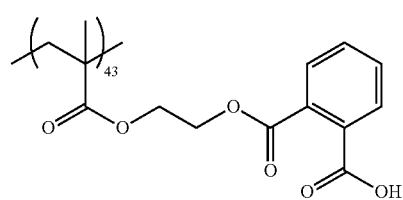

-continued

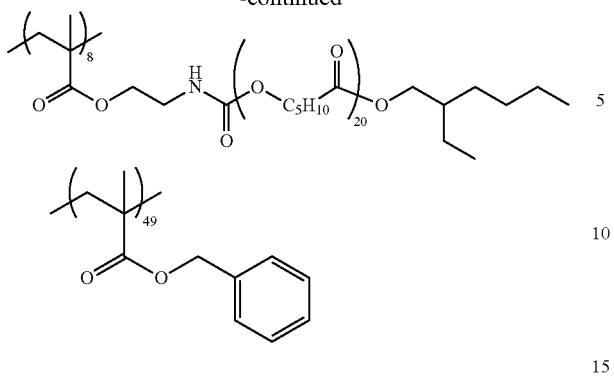

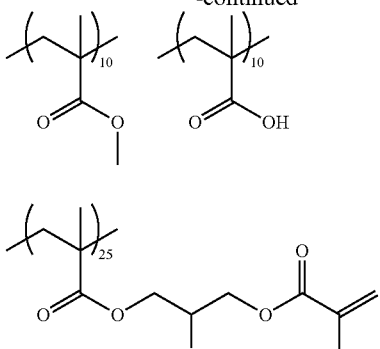

Resin 4: the following structure (Mw: 24000)

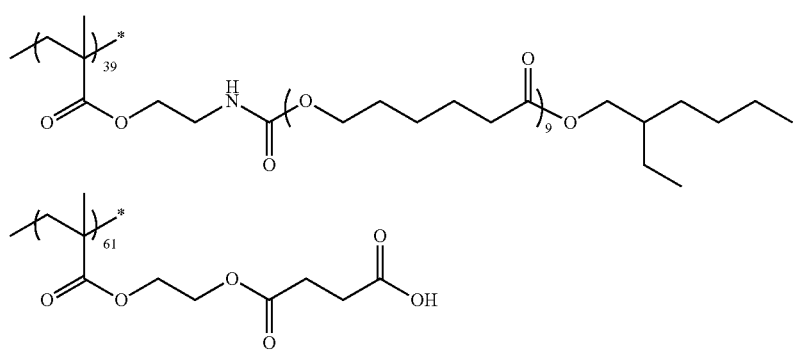

Resin 5: the following structure (Mw: 38900)

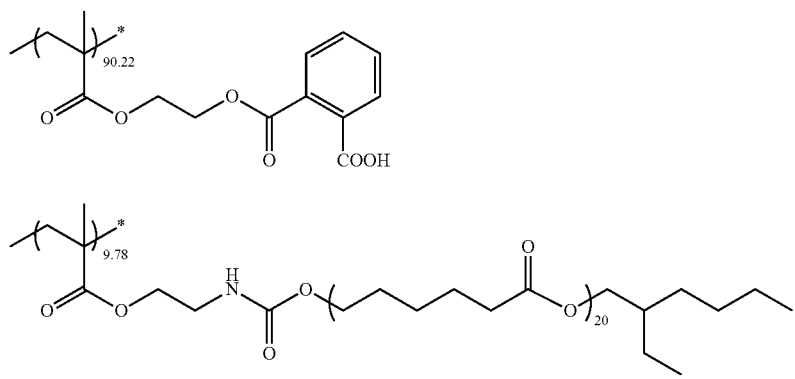

Resin 6: the following structure (Mw: 12000)

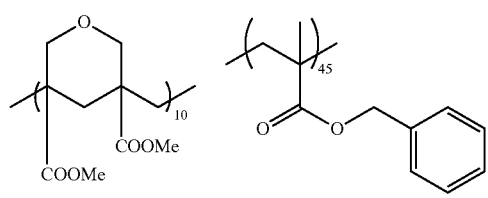

PGMEA: propylene glycol methyl ether acetate

[Preparation of Curable Composition]

Components shown in the table below were mixed with each other at a ratio shown in the table below to prepare a curable composition. The table below shows the amounts (unit: part(s) by mass) of the corresponding components.

In the table below, a TiOPc pigment dispersion 1α, a TiOPc pigment dispersion 2α, a TiOPc pigment dispersion 3α, and a TiOPc pigment dispersion 4α are pigment dispersions including TiOPc pigments (α-type TiOPc pigments) having a α-type crystal structure, respectively. In Test Example 1, a pigment dispersion in which the content of the α-type TiOPc pigment was about 70 mass % with respect to the total mass of all the TiOPc pigments was used. In addition, in Test Example 2, a pigment dispersion in which the content of the α-type TiOPc pigment was 90 mass % or higher with respect to the total mass of all the TiOPc pigments was used.

In the table below, a TiOPc pigment dispersion 1β, a TiOPc pigment dispersion 2β, a TiOPc pigment dispersion 3β, and a TiOPc pigment dispersion 4β are pigment dispersions including TiOPc pigments (β-type TiOPc pigments) having a β-type crystal structure and not including α-type TiOPc pigments, respectively.

In the table below, a TiOPc pigment dispersion 1Y, a TiOPc pigment dispersion 2Y, and a TiOPc pigment dispersion 4Y are pigment dispersions including TiOPc pigments (Y-type TiOPc pigments) having a Y-type crystal structure and not including α-type TiOPc pigments, respectively.

TABLE 3

|  | Formula 1α | Formula 1β | Formula 1Y | Formula 2α | Formula 2β | Formula 2Y | Formula 3α | Formula 4α | Formula 5α |
|---|---|---|---|---|---|---|---|---|---|
| TiOPc Pigment Dispersion 1α | 15.19 |  |  |  |  |  | 15.19 | 15.19 | 15.19 |
| TiOPc Pigment Dispersion 1β |  | 15.19 |  |  |  |  |  |  |  |
| TiOPc Pigment Dispersion 1Y |  |  | 15.19 |  |  |  |  |  |  |
| TiOPc Pigment Dispersion 2α |  |  |  | 15.19 |  |  |  |  |  |
| TiOPc Pigment Dispersion 2β |  |  |  |  | 15.19 |  |  |  |  |
| TiOPc Pigment Dispersion 2Y |  |  |  |  |  | 15.19 |  |  |  |
| TiOPc Pigment Dispersion 3α |  |  |  |  |  |  |  |  |  |
| TiOPc Pigment Dispersion 4α |  |  |  |  |  |  |  |  |  |
| TiOPc Pigment Dispersion 4β |  |  |  |  |  |  |  |  |  |
| TiOPc Pigment Dispersion 4Y |  |  |  |  |  |  |  |  |  |
| Pigment Dispersion 1-1 |  |  |  |  |  |  |  |  |  |
| Pigment Dispersion 1-2 |  |  |  |  |  |  |  |  |  |
| Pigment Dispersion 1-3 |  |  |  |  |  |  |  |  |  |
| Pigment Dispersion 1-4 |  |  |  |  |  |  |  |  |  |
| Solvent 1 | 13.59 | 13.59 | 13.59 | 13.59 | 13.59 | 13.59 | 13.59 | 13.59 | 13.59 |
| Solvent 2 | 54.94 | 54.94 | 54.94 | 54.94 | 54.94 | 54.94 | 54.94 | 54.94 | 54.94 |
| Alkali-Soluble Resin 1 (40% PGMEA) | 8.11 | 8.11 | 8.11 | 8.11 | 8.11 | 8.11 | 8.11 | 8.11 | 8.11 |
| Epoxy Resin 1 |  |  |  |  |  |  |  |  |  |
| Epoxy Resin 2 |  |  |  |  |  |  |  |  |  |
| Epoxy Resin 3 |  |  |  |  |  |  |  |  |  |
| Polymerizable Compound 1 |  |  |  |  |  |  |  |  |  |
| Polymerizable Compound 2 | 6.03 | 6.03 | 6.03 | 6.03 | 6.03 | 6.03 | 6.03 | 6.03 | 6.03 |
| Polymerization Inhibitor 1 | 0.003 | 0.003 | 0.003 | 0.003 | 0.003 | 0.003 | 0.003 | 0.003 | 0.003 |
| Surfactant (10% PGMEA) | 0.02 | 0.02 | 0.02 | 0.02 | 0.02 | 0.02 | 0.02 | 0.02 | 0.02 |
| Photopolymerization Initiator 1 |  |  |  |  |  |  | 0.87 |  |  |
| Photopolymerization Initiator 2 | 0.87 | 0.87 | 0.87 | 0.87 | 0.87 | 0.87 |  |  |  |
| Photopolymerization Initiator 3 |  |  |  |  |  |  |  | 0.87 |  |
| Photopolymerization Initiator 4 |  |  |  |  |  |  |  |  | 0.87 |
| Ultraviolet Absorber 1 | 1.12 | 1.12 | 1.12 | 1.12 | 1.12 | 1.12 | 1.12 | 1.12 | 1.12 |
| Substrate Adhesive 1 | 0.13 | 0.13 | 0.13 | 0.13 | 0.13 | 0.13 | 0.13 | 0.13 | 0.13 |
| Substrate Adhesive 2 |  |  |  |  |  |  |  |  |  |

TABLE 4

| | Formula 6α | Formula 6β | Formula 6Y | Formula 7α | Formula 8α | Formula 8β | Formula 8Y | Formula 9α | Formula 9β | Formula 9Y |
|---|---|---|---|---|---|---|---|---|---|---|
| TiOPc Pigment Dispersion 1α | 29.90 | | | | | | | | | |
| TiOPc Pigment Dispersion 1β | | 29.90 | | | | | | | | |
| TiOPc Pigment Dispersion 1Y | | | 29.90 | | | | | | | |
| TiOPc Pigment Dispersion 2α | | | | 29.90 | | | | | | |
| TiOPc Pigment Dispersion 2β | | | | | | | | | | |
| TiOPc Pigment Dispersion 2Y | | | | | | | | | | |
| TiOPc Pigment Dispersion 3α | | | | | | | | | | |
| TiOPc Pigment Dispersion 4α | | | | | 40.37 | | | 40.37 | | |
| TiOPc Pigment Dispersion 4β | | | | | | 40.37 | | | 40.37 | |
| TiOPc Pigment Dispersion 4Y | | | | | | | 40.37 | | | 40.37 |
| Pigment Dispersion 1-1 | 25.78 | 25.78 | 25.78 | 25.78 | 25.78 | 25.78 | 25.78 | 25.78 | 25.78 | 25.78 |
| Pigment Dispersion 1-2 | 10.01 | 10.01 | 10.01 | 10.01 | | | | | | |
| Pigment Dispersion 1-3 | 5.68 | 5.68 | 5.68 | 5.68 | 5.68 | 5.68 | 5.68 | 5.68 | 5.68 | 5.68 |
| Pigment Dispersion 1-4 | | | | | | | | | | |
| Solvent 1 | 16.33 | 16.33 | 16.33 | 16.33 | 16.20 | 16.20 | 16.20 | 16.47 | 16.47 | 16.47 |
| Solvent 2 | | | | | | | | | | |
| Alkali-Soluble Resin 1 (40% PGMEA) | 1.11 | 1.11 | 1.11 | 1.11 | 0.78 | 0.78 | 0.78 | 0.33 | 0.33 | 0.33 |
| Epoxy Resin 1 | | | | | | | | | | |
| Epoxy Resin 2 | | | | | | | | 2.40 | 2.40 | 2.40 |
| Epoxy Resin 3 | | | | | | | | | | |
| Polymerizable Compound 1 | 8.13 | 8.13 | 8.13 | 8.13 | 8.13 | 8.13 | 8.13 | 6.33 | 6.33 | 6.33 |
| Polymerizable Compound 2 | | | | | | | | | | |
| Polymerization Inhibitor 1 | 0.004 | 0.004 | 0.004 | 0.004 | 0.004 | 0.004 | 0.004 | 0.003 | 0.003 | 0.003 |
| Surfactant (10% PGMEA) | 0.42 | 0.42 | 0.42 | 0.42 | 0.42 | 0.42 | 0.42 | 0.42 | 0.42 | 0.42 |
| Photopolymerization Initiator 1 | 1.92 | 1.92 | 1.92 | 1.92 | 1.92 | 1.92 | 1.92 | 1.50 | 1.50 | 1.50 |
| Photopolymerization Initiator 2 | | | | | | | | | | |
| Photopolymerization Initiator 3 | | | | | | | | | | |
| Photopolymerization Initiator 4 | | | | | | | | | | |
| Ultraviolet Absorber 1 | | | | | | | | | | |
| Substrate Adhesive 1 | | | | | | | | | | |
| Substrate Adhesive 2 | 0.72 | 0.72 | 0.72 | 0.72 | 0.72 | 0.72 | 0.72 | 0.72 | 0.72 | 0.72 |

TABLE 5

| | Formula 10α | Formula 11α | Formula 12α | Formula 13α | Formula 14α | Formula 15 |
|---|---|---|---|---|---|---|
| TiOPc Pigment Dispersion 1α | | | 33.49 | | 73.86 | |
| TiOPc Pigment Dispersion 1β | | | | | | |
| TiOPc Pigment Dispersion 1Y | | | | | | |
| TiOPc Pigment Dispersion 2α | | | | | | |
| TiOPc Pigment Dispersion 2β | | | | | | |
| TiOPc Pigment Dispersion 2Y | | | | | | |
| TiOPc Pigment Dispersion 3α | | | | 55.81 | | |
| TiOPc Pigment Dispersion 4α | 40.37 | 40.37 | | | | |
| TiOPc Pigment Dispersion 4β | | | | | | |
| TiOPc Pigment Dispersion 4Y | | | | | | |

TABLE 5-continued

| | Formula 10α | Formula 11α | Formula 12α | Formula 13α | Formula 14α | Formula 15 |
|---|---|---|---|---|---|---|
| Pigment Dispersion 1-1 | 25.78 | 25.78 | 17.78 | 17.78 | | 43.31 |
| Pigment Dispersion 1-2 | | | | | | 16.82 |
| Pigment Dispersion 1-3 | 5.68 | 5.68 | | | | 9.54 |
| Pigment Dispersion 1-4 | | | 19.46 | | | |
| Solvent 1 | 16.47 | 16.47 | 17.52 | 14.97 | | 13.46 |
| Solvent 2 | | | | | 11.44 | |
| Alkali-Soluble Resin 1 (40% PGMEA) | 0.33 | 0.33 | 0.61 | 0.30 | 5.95 | 8.12 |
| Epoxy Resin 1 | 2.40 | | | | | |
| Epoxy Resin 2 | | | | | | |
| Epoxy Resin 3 | | 2.40 | | | | |
| Polymerizable Compound 1 | 6.33 | 6.33 | 8.09 | 8.09 | 6.15 | 6.15 |
| Polymerizable Compound 2 | | | | | | |
| Polymerization Inhibitor 1 | 0.003 | 0.003 | 0.004 | 0.004 | 0.003 | 0.003 |
| Surfactant (10% PGMEA) | 0.42 | 0.42 | 0.42 | 0.42 | 0.42 | 0.42 |
| Photopolymerization Initiator 1 | 1.50 | 1.50 | 1.91 | 1.91 | 1.45 | 1.45 |
| Photopolymerization Initiator 2 | | | | | | |
| Photopolymerization Initiator 3 | | | | | | |
| Photopolymerization Initiator 4 | | | | | | |
| Ultraviolet Absorber 1 | | | | | | |
| Substrate Adhesive 1 | | | | | | |
| Substrate Adhesive 2 | 0.72 | 0.72 | 0.72 | 0.72 | 0.72 | 0.72 |

Materials in the tables are as follows.

Solvent 1: cyclohexanone

Solvent 2: propylene glycol methyl ether acetate (PGMEA)

Alkali-Soluble Resin 1: (ACRYCURE RD-F8 (manufactured by Nippon Shokubai Co., Ltd.)), 40% PGMEA solution)

Epoxy Resin 1: EPICLON N-695 (manufactured by DIC Corporation, a compound having an epoxy group, the following structure)

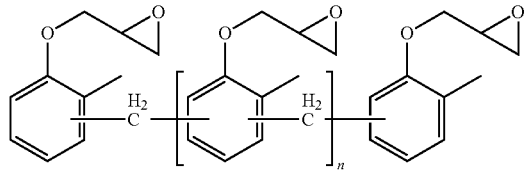

Epoxy Resin 2: EHPE 3150 (manufactured by Daicel Corporation, a compound having an epoxy group, the following structure)

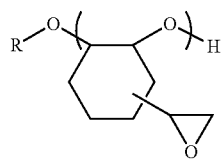

Epoxy Resin 3: jER1031S (manufactured by Mitsubishi Chemical Corporation, a compound having an epoxy group, the following structure)

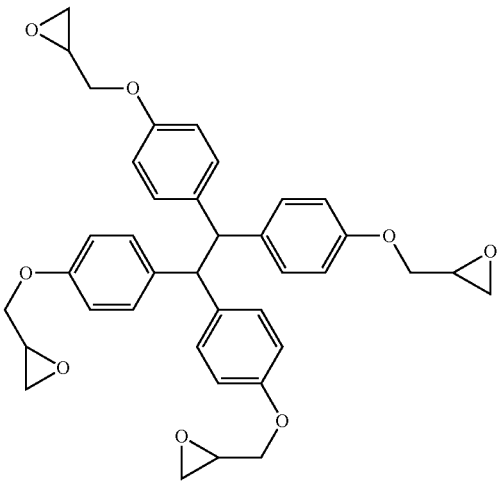 [SMILES: c1cc(C(c2ccc(OCC3CO3)cc2)C(c2ccc(OCC3CO3)cc2)c2ccc(OCC3CO3)cc2)ccc1OCC1CO1]

Polymerizable Compound 1: KAYARAD DPHA (manufactured by Nippon Kayaku Co., Ltd.)

Polymerizable Compound 2: ARONIX M-510 (manufactured by Toagosei Co., Ltd., a polyfunctional modified acrylic oligomer)

Polymerization Inhibitor 1: p-methoxyphenol (manufactured by Sanritsu Chemy)

Surfactant 1: the following mixture (Mw: 14000, 10% PGMEA solution)

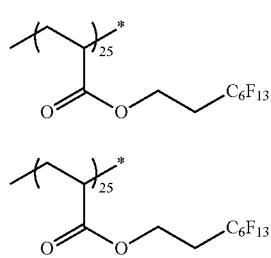
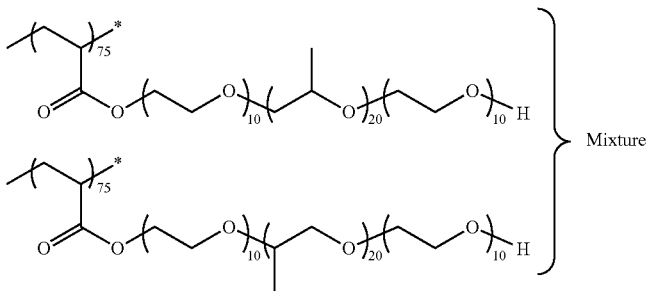

Photopolymerization Initiator 1: IRGACURE OXE01 (manufactured by BASF SE)
Photopolymerization Initiator 2: IRGACURE OXE02 (manufactured by BASF SE)
Photopolymerization Initiator 3: IRGACURE 369 (manufactured by BASF SE)
Photopolymerization Initiator 4: IRGACURE 907 (manufactured by BASF SE)
Ultraviolet Absorber 1: the following structure

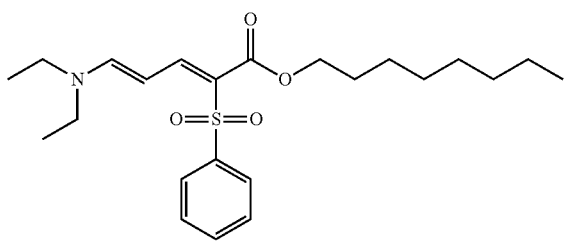 [SMILES: CCCCCCCCOC(=O)/C(=C/C=C/N(CC)CC)S(=O)(=O)c1ccccc1]

Substrate Adhesive 1: KBM-602 (manufactured by Shin-Etsu Chemical Co., Ltd.)
Substrate Adhesive 2: the following structure

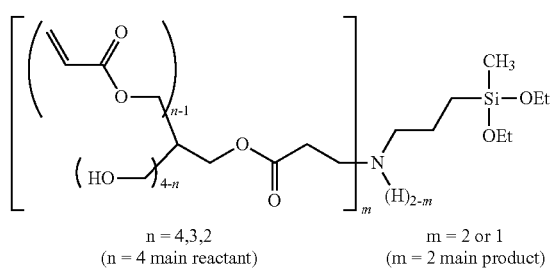

n = 4,3,2
(n = 4 main reactant)
m = 2 or 1
(m = 2 main product)

(Formula 16)

The components having the following composition 1 were mixed and stirred, and the obtained mixture was filtered through a nylon filter (manufactured by Pall Corporation) having a pore size of 0.45 μm to prepare a curable composition according to Formula 16.

| | |
|---|---|
| Red Pigment Dispersion | 34.5 parts by mass |
| TiOPc Pigment Dispersion 1 | 4.4 parts by mass |
| (the content of the α-type TiOPc pigment was 90 mass % or higher with respect to the total mass of all the TiOPc pigments) | |
| Resin 10 (40% PGMEA solution) | 2.1 parts by mass |
| Polymerizable Compound 4 | 2.1 parts by mass |
| Photopolymerization Initiator 1 | 1.1 parts by mass |
| Surfactant 1 | 4.2 parts by mass |
| PGMEA | 51.6 parts by mass |

(Formula 17)

The components having the following composition 1 were mixed and stirred, and the obtained mixture was filtered through a nylon filter (manufactured by Pall Corporation) having a pore size of 0.45 μm to prepare a curable composition according to Formula 17.

| | |
|---|---|
| Green Pigment Dispersion | 49.2 parts by mass |
| TiOPc Pigment Dispersion 1 | 5.5 parts by mass |
| (the content of the α-type TiOPc pigment was 90 mass % or higher with respect to the total mass of all the TiOPc pigments) | |
| Resin 10 (40% PGMEA solution) | 4.3 parts by mass |
| Polymerizable Compound 1 | 2.3 parts by mass |
| Photopolymerization Initiator 1 | 1.1 parts by mass |
| Surfactant 1 | 4.2 parts by mass |
| Ultraviolet Absorber 1 | 0.5 parts by mass |
| PGMEA | 32.9 parts by mass |

(Formula 18)

The components having the following composition 1 were mixed and stirred, and the obtained mixture was filtered through a nylon filter (manufactured by Pall Corporation) having a pore size of 0.45 μm to prepare a curable composition according to Formula 18.

| | |
|---|---|
| Blue Pigment Dispersion | 29.9 parts by mass |
| TiOPc Pigment Dispersion 1 | 4.3 parts by mass |
| (the content of the α-type TiOPc pigment was 90 mass % or higher with respect to the total mass of all the TiOPc pigments) | |
| Resin 10 (40% PGMEA solution) | 6.6 parts by mass |
| Polymerizable Compound 1 | 1.6 parts by mass |
| Polymerizable Compound 5 | 0.7 parts by mass |
| Photopolymerization Initiator 1 | 0.8 parts by mass |
| Surfactant 1 | 4.2 parts by mass |
| PGMEA | 51.9 parts by mass |

(Preparation of Red Composition)

The components having the following composition 1 were mixed and stirred, and the obtained mixture was filtered through a nylon filter (manufactured by Pall Corporation) having a pore size of 0.45 μm to prepare a Red composition.

| | |
|---|---|
| Red Pigment Dispersion | 51.7 parts by mass |
| Resin 10 (40% PGMEA solution) | 0.6 parts by mass |
| Polymerizable Compound 4 | 0.6 parts by mass |
| Photopolymerization Initiator 1 | 0.3 parts by mass |
| Surfactant 1 | 4.2 parts by mass |
| PGMEA | 42.6 parts by mass |

(Preparation of Green Composition)

The components having the following composition 1 were mixed and stirred, and the obtained mixture was filtered through a nylon filter (manufactured by Pall Corporation) having a pore size of 0.45 μm to prepare a Green composition.

| | |
|---|---|
| Green Pigment Dispersion | 73.7 parts by mass |
| Resin 10 (40% PGMEA solution) | 0.3 parts by mass |
| Polymerizable Compound 1 | 1.2 parts by mass |
| Photopolymerization Initiator 1 | 0.6 parts by mass |
| Surfactant 1 | 4.2 parts by mass |
| Ultraviolet Absorber 1 | 0.5 parts by mass |
| PGMEA | 19.5 parts by mass |

(Preparation of Blue Composition)

The components having the following composition 1 were mixed and stirred, and the obtained mixture was filtered through a nylon filter (manufactured by Pall Corporation) having a pore size of 0.45 μm to prepare a Blue composition.

| | |
|---|---|
| Blue Pigment Dispersion | 44.9 parts by mass |
| Resin 10 (40% PGMEA solution) | 2.1 parts by mass |
| Polymerizable Compound 1 | 1.5 parts by mass |
| Polymerizable Compound 4 | 0.7 parts by mass |
| Photopolymerization Initiator 1 | 0.8 parts by mass |
| Surfactant 1 | 4.2 parts by mass |
| PGMEA | 45.8 parts by mass |

[Preparation of Composition for Forming Infrared Transmitting Filter]

The components having the following composition 1 were mixed and stirred, and the obtained mixture was filtered through a nylon filter (manufactured by Pall Corporation) having a pore size of 0.45 μm to prepare a composition for forming an infrared transmitting filter.

(Composition 100)

| | |
|---|---|
| Red Pigment Dispersion | 46.5 parts by mass |
| Blue Pigment Dispersion | 37.1 parts by mass |
| Polymerizable Compound 5 | 1.8 parts by mass |
| Resin 10 | 1.1 parts by mass |
| Photopolymerization Initiator 5 | 0.9 parts by mass |
| Surfactant 1 | 4.2 parts by mass |
| Polymerization Inhibitor 1 | 0.001 parts by mass |
| Substrate Adhesive 2 | 0.6 parts by mass |
| PGMEA | 7.8 parts by mass |

Red Pigment Dispersion 9.6 parts by mass of C.I. Pigment Red 254, 4.3 parts by mass of C.I. Pigment Yellow 139, 6.8 parts by mass of a dispersant (Disperbyk-161 (manufactured by BYK Chemie)), and 79.3 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Red pigment dispersion was obtained.

Green Pigment Dispersion 6.4 parts by mass of C.I. Pigment Green 36, 5.3 parts by mass of C.I. Pigment Yellow 150, 5.2 parts by mass of a dispersant (Disperbyk-161 (manufactured by BYK Chemie)), and 83.1 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Green pigment dispersion was obtained.

Blue Pigment Dispersion 9.7 parts by mass of C.I. Pigment Blue 15:6, 2.4 parts by mass of C.I. Pigment Violet 23, 5.5 parts by mass of a dispersant (Disperbyk-161 (manufactured by BYK Chemie)), 82.4 parts by mass of PGMEA were mixed with each other to obtain a mixed solution, and the mixed solution was mixed and dispersed using a beads mill (zirconia beads; diameter: 0.3 mm) for 3 hours. As a result, a pigment dispersion was prepared. Next, using a high-pressure disperser NANO-3000-10 (manufactured by Nippon BEE Chemical Co., Ltd.) equipped with a pressure reducing mechanism, the pigment dispersion was further dispersed under a pressure of 2000 kg/cm$^3$ at a flow rate of 500 g/min. This dispersing treatment was repeated 10 times. As a result, a Blue pigment dispersion was obtained.

The polymerizable compound 1, the photopolymerization initiator 1, the surfactant 1, the substrate adhesives 1 and 2, the polymerization inhibitor 1, and the ultraviolet absorber 1 used in Formulae 16 to 18 are the same as the respective components shown in Tables 3 to 5.

Polymerizable Compound 4: the following structure

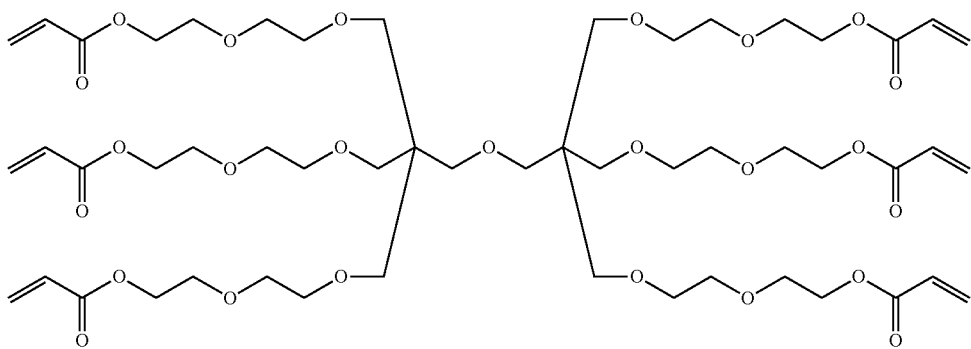 [SMILES: C=CC(=O)OCCOCCOCC(COCCOCCOC(=O)C=C)(COCCOCCOC(=O)C=C)COCC(COCCOCCOC(=O)C=C)(COCCOCCOC(=O)C=C)COCCOCCOC(=O)C=C]

Polymerizable Compound 5: the following structures (a mixture in which a molar ratio between a left compound and a right compound is 7:3)

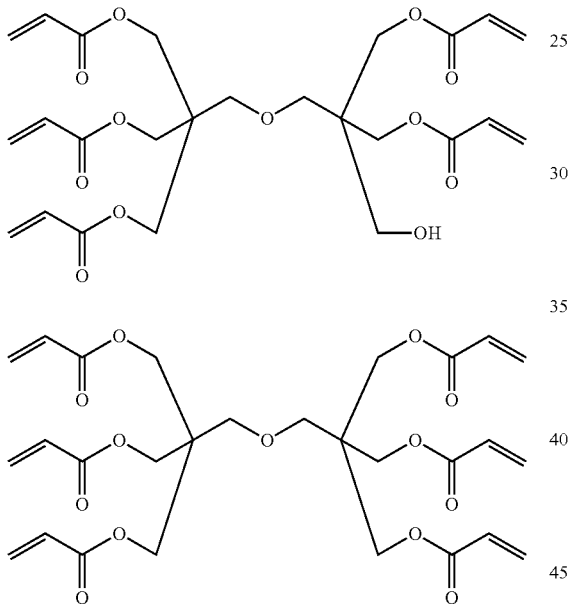

Resin 10: the following structure (acid value: 70 mgKOH/g, Mw=11000)

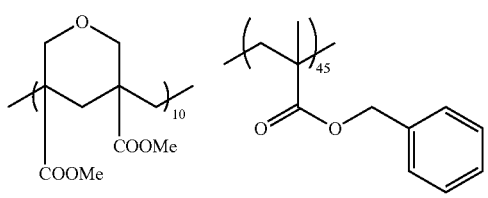

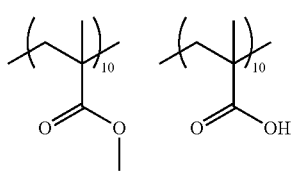

-continued

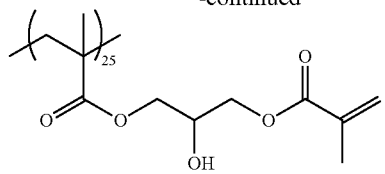

Photopolymerization initiator 5: the following structure

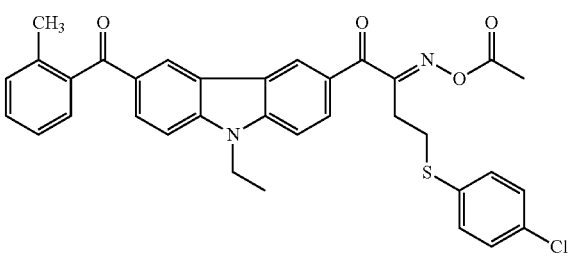 [SMILES: CCn1c2ccc(C(=O)/C(CCSc3ccc(Cl)cc3)=N/OC(C)=O)cc2c2cc(C(=O)c3ccccc3C)ccc21]

Test Example 1

[Spectral Characteristics]

A curable composition according to a formula shown in Table 6 below was applied to a glass substrate using a spin coating method such that the thickness of a post-baked film was 0.5 μm. Next, the glass wafer was dried using a hot plate at 100° C. for 120 seconds, and then was further heated (post-baked) using a hot plate at 200° C. for 300 seconds to form a film.

The light transmittance of the obtained film in a wavelength range of 400 to 1200 nm was measured using an ultraviolet-visible-near infrared spectrophotometer U-4100 (manufactured by Hitachi High-Technologies Corporation).

[Spectral Identification]

A curable composition according to a formula shown in Table 6 below was applied to a silicon wafer using a spin coating method such that the thickness of the formed film was 0.5 μm. Next, using a hot plate, the silicon wafer was heated at 100° C. for 2 minutes, and then further heated at 200° C. for 5 minutes. Next, a 2 μm Bayer pattern (infrared cut filter) was formed using a dry etching method.

Next, the Red composition was applied to the Bayer pattern of the infrared cut filter using a spin coating method such that the thickness of the formed film was 1.0 μm. Next, the silicon wafer was heated using a hot plate at 100° C. for 2 minutes. Next, using an i-ray stepper exposure device FPA-3000 i5+ (manufactured by Canon Corporation) at 1000 mJ/cm², a 2 µm dot pattern was exposed through a mask at 1000 mJ/cm². Next, puddle development was performed at 23° C. for 60 seconds using a tetramethylammonium hydroxide (TMAH) 0.3% aqueous solution. Next, the glass wafer was rinsed by spin showering and was washed with pure water. After washing with water, the Bayer pattern was heated using a hot plate at 200° C. for 5 minutes. As a result, the Red composition was patterned on the Bayer pattern of the infrared cut filter. Likewise, the Green composition and the Blue composition were sequentially patterned to form red, blue, and green color patterns.

Next, the composition (composition 100) for forming an infrared transmitting filter was applied to the pattern-formed film using a spin coating method such that the thickness of the formed film was 2.0 µm. Next, the silicon wafer was heated using a hot plate at 100° C. for 2 minutes. Next, using an i-ray stepper exposure device FPA-3000 i5+(manufactured by Canon Corporation) at 1000 mJ/cm², a 2 µm Bayer pattern was exposed through a mask at 1000 mJ/cm². Next, puddle development was performed at 23° C. for 60 seconds using a tetramethylammonium hydroxide (TMAH) 0.3% aqueous solution. Next, the glass wafer was rinsed by spin showering and was washed with pure water. After washing with water, the Bayer pattern was heated using a hot plate at 200° C. for 5 minutes. As a result, the infrared transmitting filter was patterned on a portion where the Bayer pattern of the infrared cut filter was not formed. This filter was incorporated into a solid image pickup element using a well-known method Using the obtained solid image pickup element, an object was irradiated with an infrared LED light source having an emission wavelength of 850 nm in a low-illuminance environment (0.001 Lux) to acquire images. Next, the imaging performances of the solid image pickup elements were compared to each other for evaluation. Evaluation criteria are as described below.

<Evaluation Standards>

4: Satisfactory (an object was able to be clearly recognized on the image)

3: Less satisfactory (an object was able to be recognized on the image)

2: Slightly unsatisfactory (an object was able to be recognized on the image, but the noise is large)

1: Unsatisfactory (an object was not able to be recognized on the image)

content of the α-type TiOPc pigment was about 70 mass % with respect to the total mass of all the TiOPc pigments.

In Comparative Examples 1-1 and 1-2, the TiOPc pigment (β-type TiOPc pigment) having a β-type crystal structure was used as the TiOPc pigment. In addition, in Comparative Examples 1-3 and 1-4, the TiOPc pigment (Y-type TiOPc pigment) having a Y-type crystal structure was used as the TiOPc pigment. In addition, the TiOPc pigment dispersion used in the formulae of Comparative Examples 1-1 to 1-4 did not include the α-type TiOPc pigment as the TiOPc pigment.

As shown in Table 6, in Examples, light shielding properties to infrared light at 850 nm were excellent.

In addition, in Examples, transparency to visible light and light shielding properties to infrared light at 850 nm were able to be simultaneously realized at a high level as compared to Comparative Examples. That is, in Comparative Examples 1-1 and 1-2 in which the β-type TiOPc pigment was used, light shielding properties to infrared light at 850 nm were poor. In addition, in Comparative Examples 1-3 and 1-4 in which the Y-type TiOPc pigment was used, transparency to visible light (in particular, transparency to light at 400 nm and 700 nm) was poor.

In addition, the spectral identification of Examples was higher than that of Comparative Examples. In addition, in Examples 1-1 to 1-3 in which the oxime compound was used as the photopolymerization initiator, the spectral identification was higher than that of Examples 1-4 to 1-5 in which a polymerization initiator other than the oxime compound was used. It is considered that, in Examples 1-1 to 1-3, the curing properties of the film surface were able to be improved by using the oxime compound as the photopolymerization initiator; as a result, in the process of forming the red, blue, and green color patterns, there are little effects such as color mixing of residues caused by the respective coloring compositions, and thus spectral identification were particularly excellent.

Test Example 2

[Spectral Characteristics]

A curable composition according to a formula shown in Table 7 below was applied to a glass substrate using a spin coating method such that the thickness of a post-baked film was 1.5 µm. Next, the glass wafer was dried using a hot plate

TABLE 6

| | | Spectral Characteristics (%) | | | | Spectral Identification |
|---|---|---|---|---|---|---|
| | Formula | 400 nm | 550 nm | 700 nm | 850 nm | (LED 850 nm) |
| Example 1-1 | Formula 1α | 57.0 | 81.8 | 49.4 | 50.3 | 4 |
| Example 1-2 | Formula 2α | 57.0 | 81.8 | 49.4 | 50.3 | 4 |
| Example 1-3 | Formula 3α | 57.0 | 81.8 | 49.4 | 50.3 | 4 |
| Example 1-4 | Formula 4α | 57.0 | 81.8 | 49.4 | 50.3 | 3 |
| Example 1-5 | Formula 5α | 57.0 | 81.8 | 49.4 | 50.3 | 3 |
| Comparative Example 1-1 | Formula 1β | 52.7 | 84.9 | 20.6 | 88.6 | 1 |
| Comparative Example 1-2 | Formula 2β | 52.7 | 84.9 | 20.6 | 88.6 | 1 |
| Comparative Example 1-3 | Formula 1Y | 40.8 | 82.4 | 30.3 | 42.2 | 2 |
| Comparative Example 1-4 | Formula 2Y | 40.8 | 82.4 | 30.3 | 42.2 | 2 |

In Examples 1-1 to 1-5, in the TiOPc pigment dispersion according to each of the formulae, the TiOPc pigment (α-type TiOPc pigment) having an α-type crystal structure was used as the TiOPc pigment. In addition, in the TiOPc pigment dispersion according to each of the formulae, the at 100° C. for 120 seconds, and then was further heated (post-baked) using a hot plate at 200° C. for 300 seconds to form a film.

The light transmittance of the obtained film in a wavelength range of 400 to 1200 nm was measured using an ultraviolet-visible-near infrared spectrophotometer U-4100 (manufactured by Hitachi High-Technologies Corporation).

[Heat Resistance]

A curable composition according to a formula shown in Table 7 below was applied to a glass substrate using a spin coating method such that the thickness of a post-baked film was 1.5 μm. Next, the glass wafer was dried using a hot plate at 100° C. for 120 seconds, and then was further heated (post-baked) using a hot plate at 200° C. for 300 seconds to form a film.

The obtained film was heated using a hot plate at 260° C. for 300 seconds. The light transmittance of the film in a wavelength range of 400 to 1200 nm was measured before and after heating to evaluate a change in transmittance.

Change in Transmittance=|(Transmittance (%) after Heating at Each Wavelength−Transmittance (%) before Heating at Each Wavelength)|

<Evaluation Standards>

5: A maximum value of the change between the transmittances before and after heating is lower than 1%

4: A maximum value of the change between the transmittances before and after heating is 1% or higher and lower than 3%

3: A maximum value of the change between the transmittances before and after heating is 3% or higher and lower than 5%

2: A maximum value of the change between the transmittances before and after heating is 5% or higher and lower than 10%

1: A maximum value of the change between the transmittances before and after heating 10% or higher

[Spectral Identification]

A curable composition according to a formula shown in Table 7 below was applied to a silicon wafer using a spin coater such that the thickness of a dried film was 1.5 μm, and was heated (pre-baked) using a hot plate at 100° C. for 120 seconds.

Next, using an i-ray stepper exposure device FPA-3000 i5+(manufactured by Canon Corporation), the curable composition was exposed at an optimum exposure dose through a photomask on which a square pixel pattern having a size of 2.0×2.0 μm was formed. The optimum exposure dose was determined based on an exposure dose at which the square pixel pattern was resolved while increasing the exposure dose from 50 to 750 mJ/cm$^2$ at an interval of 50 mJ/cm$^2$.

Next, the silicon wafer on which the exposed coating film was formed was placed on a horizontal rotary table of a spin-shower developing machine (DW-30, manufactured by Chemitronics Co., Ltd.) and underwent puddle development at 23° C. for 60 seconds using CD-2060 (manufactured by Fujifilm Electronic Materials Co., Ltd.) to form a pattern (infrared transmitting pattern) on the silicon wafer.

The silicon wafer on which the infrared transmitting pattern was formed was rinsed with pure water and was dried by spraying. Further, the silicon wafer was heated (post-baked) using a hot plate at 200° C. for 300 seconds. This way, silicon wafers having the infrared transmitting pattern were obtained.

Each of the obtained silicon wafer having the infrared transmitting pattern was incorporated into a solid image pickup element as a near infrared transmitting filter using a well-known method. Using the obtained solid image pickup element, an object was irradiated with an infrared LED light source having an emission wavelength of 940 urn in a low-illuminance environment (0.001 Lux) to acquire images. Next, the imaging performances of the solid image pickup elements were compared to each other for evaluation. Evaluation standards are as described below.

<Evaluation Standards>

4: Satisfactory (an object was able to be clearly recognized on the image)

3: Less satisfactory (an object was able to be recognized on the image)

2: Slightly unsatisfactory (an object was able to be recognized on the image, but the noise is large)

1: Unsatisfactory (an object was not able to be recognized on the image)

TABLE 7

|  |  | Spectral Characteristics (%) | | | | | | Spectral |
| --- | --- | --- | --- | --- | --- | --- | --- | --- |
|  | Formula | 400 nm | 550 nm | 700 nm | 850 nm | 940 nm | Heat Resistance | Identification (LED 940 nm) |
| Example 2-1 | Formula 6α | 2.8 | 1.4 | 3.7 | 8.9 | 74.9 | 4 | 4 |
| Example 2-2 | Formula 7α | 2.8 | 1.4 | 3.7 | 8.9 | 74.9 | 4 | 4 |
| Example 2-3 | Formula 8α | 2.8 | 1.4 | 3.7 | 8.9 | 74.9 | 4 | 4 |
| Example 2-4 | Formula 9α | 2.8 | 1.4 | 3.7 | 8.9 | 74.9 | 5 | 4 |
| Example 2-5 | Formula 10α | 2.8 | 1.4 | 3.7 | 8.9 | 74.9 | 5 | 4 |
| Example 2-6 | Formula 11α | 2.8 | 1.4 | 3.7 | 8.9 | 74.9 | 5 | 4 |
| Example 2-7 | Formula 12α | 1.9 | 1.7 | 6.4 | 10.0 | 73.3 | 4 | 4 |
| Example 2-8 | Formula 13α | 1.9 | 1.7 | 6.4 | 10.0 | 73.3 | 4 | 4 |
| Comparative Example 2-1 | Formula 6β | 2.1 | 1.6 | 0.2 | 62.7 | 88.1 | 2 | 1 |
| Comparative Example 2-2 | Formula 8β | 2.1 | 1.6 | 0.2 | 62.7 | 88.1 | 2 | 1 |
| Comparative Example 2-3 | Formula 9β | 2.1 | 1.6 | 0.2 | 62.7 | 88.1 | 2 | 1 |
| Comparative Example 2-4 | Formula 6Y | 0.9 | 1.4 | 0.7 | 4.9 | 57.9 | 1 | 2 |
| Comparative Example 2-5 | Formula 8Y | 0.9 | 1.4 | 0.7 | 4.9 | 57.9 | 1 | 2 |
| Comparative Example 2-6 | Formula 9Y | 0.9 | 1.4 | 0.7 | 4.9 | 57.9 | 1 | 2 |

In Examples 2-1 to 2-8, in the TiOPc pigment dispersion according to each of the formulae, the TiOPc pigment (α-type TiOPc pigment) having an α-type crystal structure was used as the TiOPc pigment. In addition, in the TiOPc pigment dispersion according to each of the formulae, the content of the α-type TiOPc pigment was 90 mass % or higher with respect to the total mass of all the TiOPc pigments.

In Comparative Examples 2-1 to 2-3, the TiOPc pigment (β-type TiOPc pigment) having a β-type crystal structure was used as the TiOPc pigment. In addition, in Comparative Examples 2-4 to 2-6, the TiOPc pigment (Y-type TiOPc pigment) having a Y-type crystal structure was used as the TiOPc pigment. In addition, the TiOPc pigment dispersion used in the formulae of Comparative Examples 2-1 to 2-6 did not include the α-type TiOPc pigment as the TiOPc pigment.

As shown in the tables, the spectral identification of Examples was higher than that of Comparative Examples. Further, heat resistance was also excellent.

In addition, in Examples, light shielding properties to visible light and transmittance to infrared light at 940 nm were able to be simultaneously realized at a high level as compared to Comparative Examples. That is, in Comparative Examples 2-1 and 2-3 in which the β-type TiOPc pigment was used, light shielding properties to infrared light at 850 nm were poor. Therefore, the noise was large, and the spectral identification was insufficient. In addition, in Comparative Examples 2-4 to 2-6 in which the Y-type TiOPc pigment was used, transmittance to infrared light at 940 nm was poor.

Test Example 3

Infrared transmitting filters were manufactured using the same method as in Example 2-1 of Test Example 2, except that compositions according to Formulae 14α and 15 were used instead of the curable composition according to Formula 6α. With these Infrared transmitting filters, the same effects as in Example 2-1 were obtained.

Test Example 4

The curable composition according to Formula 16 was applied to a silicon wafer using a spin coating method such that the thickness of the formed film was 1.5 μm, and then was heated using a hot plate at 100° C. for 2 minutes. Next, using an i-ray stepper exposure device FPA-3000 i5+(manufactured by Canon Corporation) at 1000 mJ/cm², a 2 μm dot pattern was exposed through a mask at 1000 mJ/cm². Next, puddle development was performed at 23° C. for 60 seconds using a tetramethylammonium hydroxide (TMAH) 0.3% aqueous solution. Next, the glass wafer was rinsed by spin showering and was washed with pure water. After washing with water, the dot pattern was heated using a hot plate at 200° C. for 5 minutes. As a result, the curable composition according to Formula 16 was patterned to form a red color pattern. Likewise, the curable composition according to Formula 17 and the curable composition according to Formula 18 were sequentially patterned to form a green color pattern and a blue color pattern.

Next, the composition (composition 100) for forming an infrared transmitting filter was applied to the pattern-formed film using a spin coating method such that the thickness of the formed film was 2.0 μm. Next, the silicon wafer was heated using a hot plate at 100° C. for 2 minutes. Next, using an i-ray stepper exposure device FPA-3000 i5+(manufactured by Canon Corporation) at 1000 mJ/cm², a 2 μm Bayer pattern was exposed through a mask at 1000 mJ/cm². Next, puddle development was performed at 23° C. for 60 seconds using a tetramethylammonium hydroxide (TMAH) 0.3% aqueous solution. Next, the silicon wafer was rinsed by spin showering, was washed with pure water, and was heated using a hot plate at 200° C. for 5 minutes. As a result, the infrared transmitting filter was patterned on a portion where the red, green, and blue patterns were not formed. This filter was incorporated into a solid image pickup element using a well-known method Using the obtained solid image pickup element, an object was irradiated with an infrared LED light source having an emission wavelength of 850 nm in a low-illuminance environment (0.001 Lux) to acquire images. Next, the imaging performances of the solid image pickup elements were compared to each other for evaluation. The object was able to be clearly recognized on the image.

EXPLANATION OF REFERENCES

110: solid image pickup element
111, 111a: infrared cut filter
112: color filter
114: infrared transmitting filter
115: microlens
116: planarizing layer
151: support

What is claimed is:

1. A curable composition for forming an infrared transmitting filter comprising:
   an α-type oxytitanium phthalocyanine pigment;
   a curable compound; and
   a coloring material that shields visible light in a wavelength range of 450 to 650 nm;
   wherein the coloring material includes two or more chromatic colorants or an organic black colorant.

2. The curable composition according to claim 1,
   wherein the α-type oxytitanium phthalocyanine pigment is represented by the following Formula (1),

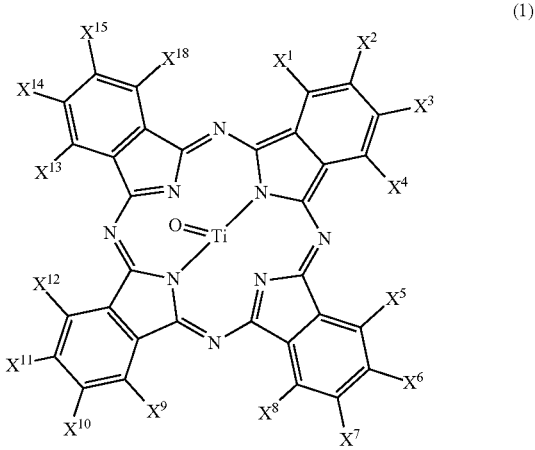

in Formula (1), $X^1$ to $X^{16}$ each independently represent a hydrogen atom or a halogen atom.

3. The curable composition according to claim 2,
wherein the curable compound includes a compound having an epoxy group.

4. A method of manufacturing the curable composition according to claim 1, the method comprising:
dispersing an α-type oxytitanium phthalocyanine pigment and a pigment other than an oxytitanium phthalocyanine pigment in the presence of a solvent.

5. A film comprising a curable composition layer which is formed using the curable composition according to claim 1,
wherein the curable composition layer is formed by applying the curable composition.

6. The film according to claim 5,
wherein a maximum value of a light transmittance of the film in a thickness direction in a wavelength range of 400 to 830 nm is 20% or lower and that a minimum value of a light transmittance of the film in the thickness direction in a wavelength range of 1000 to 1300 nm is 70% or higher.

7. An infrared transmitting filter comprising a curable composition layer which is formed using a curable composition for forming an infrared transmitting filter, wherein the curable composition layer is formed by applying the curable composition, and
the curable composition contains:
an α-type oxytitanium phthalocyanine pigment;
a curable compound; and
a coloring material that shields visible light in a wavelength range of 450 to 650 nm;
wherein the coloring material includes two or more chromatic colorants or an organic black colorant.

8. A pattern forming method comprising:
forming a curable composition layer on a support using the curable composition according to claim 1; and
forming a pattern on the curable composition layer using a photolithography method or a dry etching method.

9. A device comprising:
the film according to claim 5,
wherein the device is a solid image pickup element, an infrared sensor, or an image display device.

10. The curable composition according to claim 1,
wherein the two or more chromatic colorants are selected from the following combination of chromatic colorants;
(1) a combination of chromatic colorants includes a yellow colorant, a blue colorant, a violet colorant, and a red colorant;
(2) a combination of chromatic colorants includes a yellow colorant, a blue colorant, and a red colorant;
(3) a combination of chromatic colorants includes a yellow colorant, a violet colorant, and a red colorant;
(4) a combination of chromatic colorants includes a yellow colorant and a violet colorant;
(5) a combination of chromatic colorants includes a green colorant, a blue colorant, a violet colorant, and a red colorant;
(6) a combination of chromatic colorants includes a violet colorant and an orange colorant;
(7) a combination of chromatic colorants includes a green colorant, a violet colorant, and a red colorant; and
(8) a combination of chromatic colorants includes a green colorant and a red colorant.

11. The curable composition according to claim 1,
wherein the two or more chromatic colorants are a combination of chromatic colorants includes a yellow colorant, a blue colorant, and a red colorant.

12. The curable composition according to claim 1,
wherein the organic black colorant is selected from the group consisting of a bisbenzofuranone compound, an azomethine compound, a perylene compound and an azo compound.

13. The curable composition according to claim 1,
wherein the curable composition does not include substantially an oxytitanium phthalocyanine pigment having another crystal structure other than an α-type oxytitanium phthalocyanine pigment.

14. A method of manufacturing an infrared transmitting filter comprising:
providing a curable composition comprises
an α-type oxytitanium phthalocyanine pigment;
a curable compound; and
a coloring material that shields visible light in a wavelength range of 450 to 650 nm, wherein the coloring material includes two or more chromatic colorants or an organic black colorant:
applying the curable composition on a substrate to make a film of the curable composition; and
curing the film of the curable composition.

15. The curable composition according to claim 1, further comprising:
a photoradical polymerization initiator,
wherein the curable compound includes a photoradically polymerizable compound.

16. The curable composition according to claim 15,
wherein the photoradical polymerization initiator is an oxime compound.

17. The curable composition according to claim 16,
wherein the curable compound includes a compound having an epoxy group.

18. The curable composition according to claim 1,
wherein the curable compound includes a compound having an epoxy group.

* * * * *